(12) United States Patent
Huang et al.

(10) Patent No.: US 12,142,649 B2
(45) Date of Patent: Nov. 12, 2024

(54) SEMICONDUCTOR STRUCTURE WITH CONDUCTIVE CARBON LAYER AND METHOD FOR MANUFACTURING THE SAME

(71) Applicant: TAIWAN SEMICONDUCTOR MANUFACTURING COMPANY, LTD., Hsinchu (TW)

(72) Inventors: Jhih-Rong Huang, Hsinchu (TW); Mrunal Abhijith Khaderbad, Hsinchu (TW); Yi-Bo Liao, Hsinchu (TW); Yen-Tien Tung, Hsinchu (TW); Wei-Yen Woon, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 115 days.

(21) Appl. No.: 17/685,517

(22) Filed: Mar. 3, 2022

(65) Prior Publication Data
US 2023/0282715 A1 Sep. 7, 2023

(51) Int. Cl.
| | | |
|---|---|---|
| *H01L 29/417* | (2006.01) | |
| *H01L 21/8238* | (2006.01) | |
| *H01L 27/088* | (2006.01) | |
| *H01L 27/092* | (2006.01) | |
| *H01L 29/40* | (2006.01) | |
| *H01L 29/45* | (2006.01) | |

(52) U.S. Cl.
CPC .... *H01L 29/41725* (2013.01); *H01L 21/8238* (2013.01); *H01L 27/088* (2013.01); *H01L 27/092* (2013.01); *H01L 29/401* (2013.01); *H01L 29/45* (2013.01)

(58) Field of Classification Search
None
See application file for complete search history.

(56) References Cited

U.S. PATENT DOCUMENTS

| | | | | |
|---|---|---|---|---|
| 2013/0248823 A1* | 9/2013 | Bol | ................... | H01L 29/41733 257/29 |
| 2014/0183651 A1* | 7/2014 | Lee | ................. | H01L 21/823857 257/369 |
| 2017/0018463 A1* | 1/2017 | Bu | ..................... | H01L 23/53238 |
| 2017/0141236 A1* | 5/2017 | Wu | ..................... | H01L 27/1288 |
| 2020/0357700 A1* | 11/2020 | Wang | ................. | H01L 29/4966 |

* cited by examiner

*Primary Examiner* — William C Trapanese
(74) *Attorney, Agent, or Firm* — Birch, Stewart, Kolasch & Birch, LLP

(57) ABSTRACT

A semiconductor structure includes a semiconductor substrate, a first source/drain portion, a second source/drain portion, a first metal contact, a second metal contact and a first conductive carbon layer. The first and second source/drain portions are formed over the semiconductor substrate, and are spaced apart from each other. The first source/drain portion has a conductivity type different from that of the second source/drain portion. The first and second metal contacts are respectively formed on the first and second source/drain portions. The first conductive carbon layer is formed between the first source/drain portion and the first metal contact.

20 Claims, 25 Drawing Sheets

SEMICONDUCTOR STRUCTURE WITH CONDUCTIVE CARBON LAYER AND METHOD FOR MANUFACTURING THE SAME

BACKGROUND

With scaling down of a chip size, critical dimension (CD) of contacts continues to decrease, which results in a higher contact resistance between a source/drain region and a metal contact. Therefore, contact resistance has become a critical factor in advanced semiconductor technologies, and there is continuous demand to develop a structure and/or a method to reduce the contact resistance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
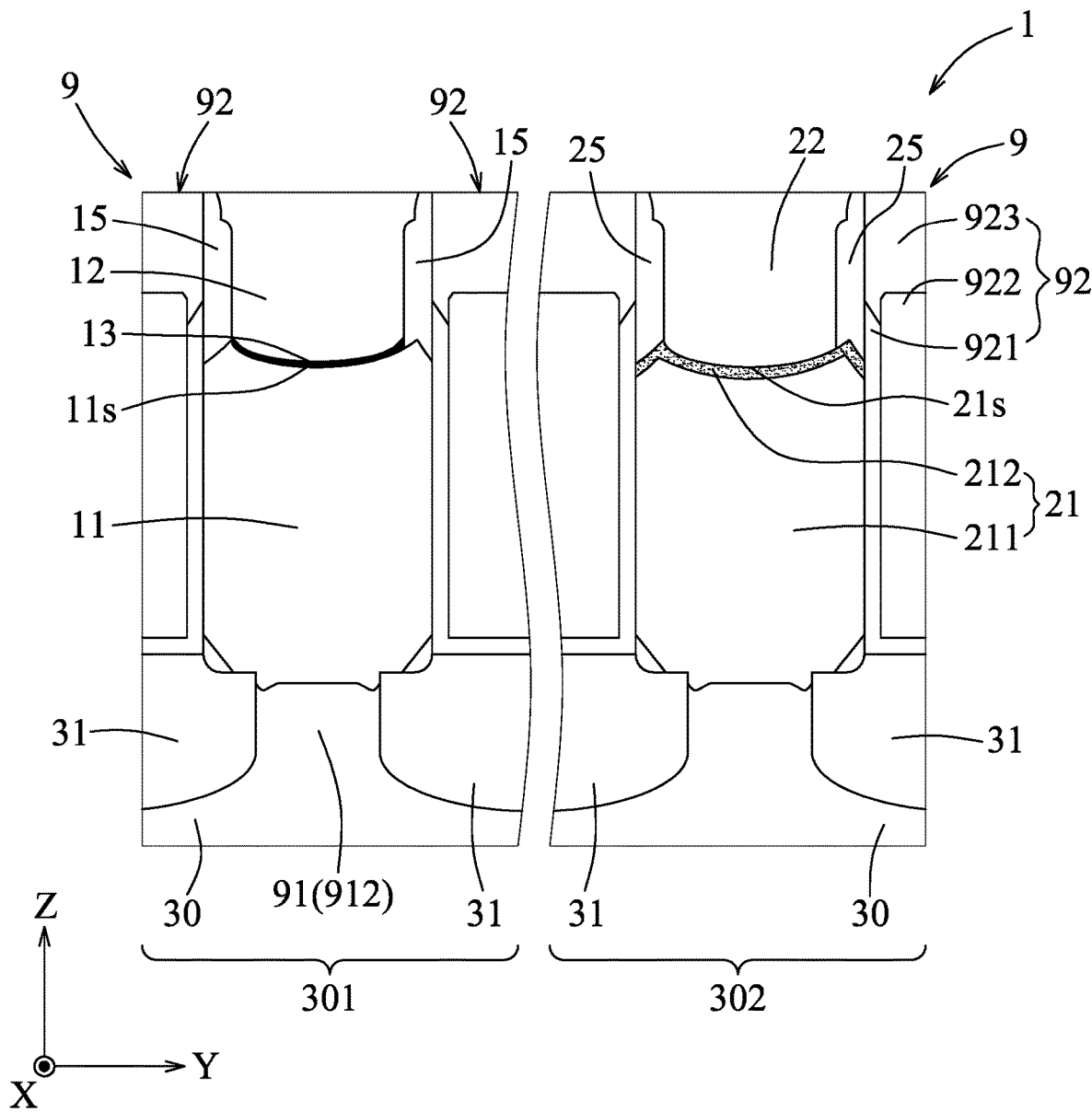
FIG. 1 illustrates a fragmentary schematic sectional view of a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In advanced technology nodes, a source/drain contact resistance (Rcsd) at a metal-semiconductor junction (i.e., a junction between a metal contact and a source/drain structure) becomes a dominant component in a source/drain series resistance (Rp). When varying the work function of a metal, a reduction of a Schottky barrier height (SBH) at the metal-semiconductor junction is limited. This may be caused by "Fermi level pinning" effect, i.e., the electronic state of the metal permeates into a gap of the semiconductor (metal induce gap state) and the Fermi level of the metal is pinned at a certain gap state. Therefore, many approaches are proposed to further reduce the SBH. For example, different silicides may be used in the metal-semiconductor junctions of an N-FET (n-type field effect transistor) and a P-FET (p-type FET). The present disclosure is directed to a semiconductor structure having a low Rcsd and a method for manufacturing the same. The semiconductor structure may be applied to various transistors, such as bipolar junction transistors (BJT), field effect transistors (FET), metal-oxide-semiconductor field-effect transistor (MOSFET) [e.g., planar FET, fin FET (FINFET), gate-all-around FET (GAAFET), multi-bridge channel FET (MBCFET)], junction-gate field-effect transistor (JFET), insulated-gate bipolar transistor (IGBT), metal-semiconductor field-effect transistor (MESFET), or high-electron-mobility transistor (HEMT). Other suitable applications for the semiconductor structure are within the contemplated scope of disclosure. Furthermore, the semiconductor structure of this disclosure can be used in all generation devices. In some embodiments, the semiconductor structure may be used in varieties of advanced semiconductor technology nodes or generations, such as a 2 nm (N2) generation device or other generation devices smaller than the N2 generation device, but is not limited thereto. In some embodiments, the semiconductor structure is a silicide-free semiconductor structure.

FIG. 1 is a fragmentary schematic sectional view illustrating a semiconductor structure 1 in accordance with some embodiments. Some repeating structures are omitted in FIG. 1 for the sake of brevity.

The semiconductor structure 1 includes a semiconductor substrate 30, a first source/drain portion 11, a second source/drain portion 21, a first metal contact 12, a second metal contact 22, and a first conductive carbon layer 13. The first and second source/drain portions 11, 21 are formed over the semiconductor substrate 30, and are spaced apart from each other in a Y direction. The first and second metal contacts 12, 22 are respectively formed on the first and second source/drain portions 11, 21. The first conductive carbon layer 13 is formed between the first source/drain portion 11 and the first metal contact 12. The first source/drain portion 11 has a conductivity type different from that of the second source/drain portion 21.

In some embodiments, the semiconductor substrate 30 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The material for forming the semiconductor substrate 30 may be doped with p-type impurities or n-type impurities, or undoped. In addition, the semiconductor substrate 30 may be a bulk silicon substrate, a silicon-on-insulator (SOI) substrate, or a germanium-on-insulator (GOI) substrate. Other suitable materials for the semiconductor substrate 30 are within the contemplated scope of disclosure.

The first source/drain portion 11 and the second source/drain portion 21 are disposed on a first region 301 and a second region 302 of the semiconductor substrate 30, respectively, and have a first upper surface 11s and a second upper surface 21s, respectively. In some embodiments, each of the first source/drain portion 11 and the second source/drain portion 21 may be doped with an n-type impurity or a p-type impurity, and may be formed as a single layer structure or a multi-layered structure having several sub-layers with different doping concentration. In some embodiments, the first source/drain portion 11 has an n-type conductivity, and includes single crystalline silicon, polycrystalline silicon or other suitable materials doped with an n-type impurity so as to function as a source/drain of an n-FET. The n-type impurity may be, for example, but not limited to, nitrogen (N), phosphorous (P), arsenic (As), antimony (Sb), other suitable materials, or combinations thereof. In some embodiments, the second source/drain portion 21 has a p-type conductivity, and includes single crystalline or polycrystalline silicon, single crystalline or polycrystalline silicon germanium, or other suitable materials doped with a p-type impurity so as to function as a source/drain of a p-FET. The p-type impurity may be, for example, but not limited to, boron (B), aluminum (Al), gallium (Ga), indium (In), other suitable materials, or combinations thereof. In some embodiments, the source/drain of the p-FET is made of silicon germanium (SiGe), and has a main part 211 and an upper part 212 that is disposed on the main part 211 and that is proximate to the second metal contact 22 with respect to the main part 211. Since Ge has an electron affinity of 4.1 eV which is larger than the electron affinity of silicon (i.e., 4 eV), the upper part 212 may have a higher concentration of germanium (Ge) compared with that of the main part 211 so as to achieve a lower Schottky barrier height (SBH) and a lower Rcsd at a metal-semiconductor junction (e.g., a junction between the second metal contact 22 and the second source/drain portion 21). In some embodiments, the conductivity types of the first and second source/drain portions 11, 21 may be swapped, that is, the first source/drain portion 11 has a p-type conductivity, and the second source/drain portion 12 has an n-type conductivity.

Each of the first metal contact 12 and the second metal contact 22 may include a conductive material, such as elemental metal, alloy of at least two elemental metals, or conductive metal compound. In some embodiments, each of the first metal contact 12 and the second metal contact 22 may be made of cobalt (Co), ruthenium (Ru), tungsten (W), molybdenum (Mo), or alloys thereof. Other suitable conductive materials for the first metal contact 12 and the second metal contact 22 are within the contemplated scope of disclosure. The first metal contact 12 may be made of a conductive material which is the same as or different from that of the second metal contact 22. In some embodiments, when an n-FET includes the first metal contact 12 and a p-FET includes the second metal contact 22, the second metal contact 22 has a work function higher than that of the first metal contact 12 so as to obtain a lower SBH at a metal-semiconductor junction (i.e., a junction between the first metal contact 12 and the first source/drain portion 11, or a junction between the second metal contact 22 and the second source/drain portion 21). In some embodiments, the semiconductor structure 1 further includes a barrier layer (not shown) and a liner layer (not shown) disposed beneath each of the first and second metal contacts 12, 22. In some embodiments, the barrier layer is provided to prevent metal from being diffused out of the first metal contact 12 or the second metal contact 22, and may be made of tantalum nitride (TaN), but is not limited thereto. Other suitable materials for the barrier layer are within the contemplated scope of disclosure. In some embodiments, the liner layer is provided to facilitate formation of the first metal contact 12 or the second metal contact 22 and may be made of cobalt, but is not limited thereto. Other suitable materials for the liner layer are within the contemplated scope of disclosure.

In some embodiments, the first conductive carbon layer 13 may be made of an electrical conductive carbon material, such as graphite, or graphene, but is not limited thereto. Other suitable materials for the first conductive carbon layer 13 are within the contemplated scope of disclosure. In some embodiments, the first conductive carbon layer has a thickness ranging from about 2 Å to about 10 Å. In some embodiments, the first conductive carbon layer 13 includes one to three layers of graphene (i.e., a mono-layered, a bi-layered, or a tri-layered graphene layer). In the case that the first conductive carbon layer 13 is a mono-layered graphene layer, the first conductive carbon layer 13 has a thickness ranging from about 2 Å to about 5 Å. In the case that the first conductive carbon layer 13 is a tri-layered graphene layer, the first conductive carbon layer 13 has a thickness up to about 10 Å. In some embodiments, the first conductive carbon layer 13 is disposed on the first upper surface 11s of the first source/drain portion 11.

In some embodiments, the semiconductor substrate 30 includes a plurality of the first regions 301 (one of which is shown in FIG. 1) and a plurality of second regions 302 (one of which is shown in FIG. 1). At each of the first regions 301, two of the first source/drain portions 11 (one of which is shown in FIG. 1), two of the first metal contacts 12 (one of which is shown in FIG. 1), and two of the first conductive carbon layers 13 (one of which is shown in FIG. 1) are disposed. Similarly, at each of the second regions 302, two of the second source/drain portions 21 (one of which is shown in FIG. 1) and two of the second metal contacts 22 (one of which is shown in FIG. 1) are disposed. Although not shown in FIG. 1, the two first source/drain portions 11 disposed on each of the first regions 301 are spaced apart from each other in an X direction transverse to the Y direction, and the two second source/drain portions 21 disposed on each of the second regions 302 are spaced apart from each other in the X direction. In addition, the semiconductor structure 1 may further include a plurality of semiconductor units 9 disposed respectively on the first and second regions 301, 302 of the semiconductor substrate 30.

Figure 2:
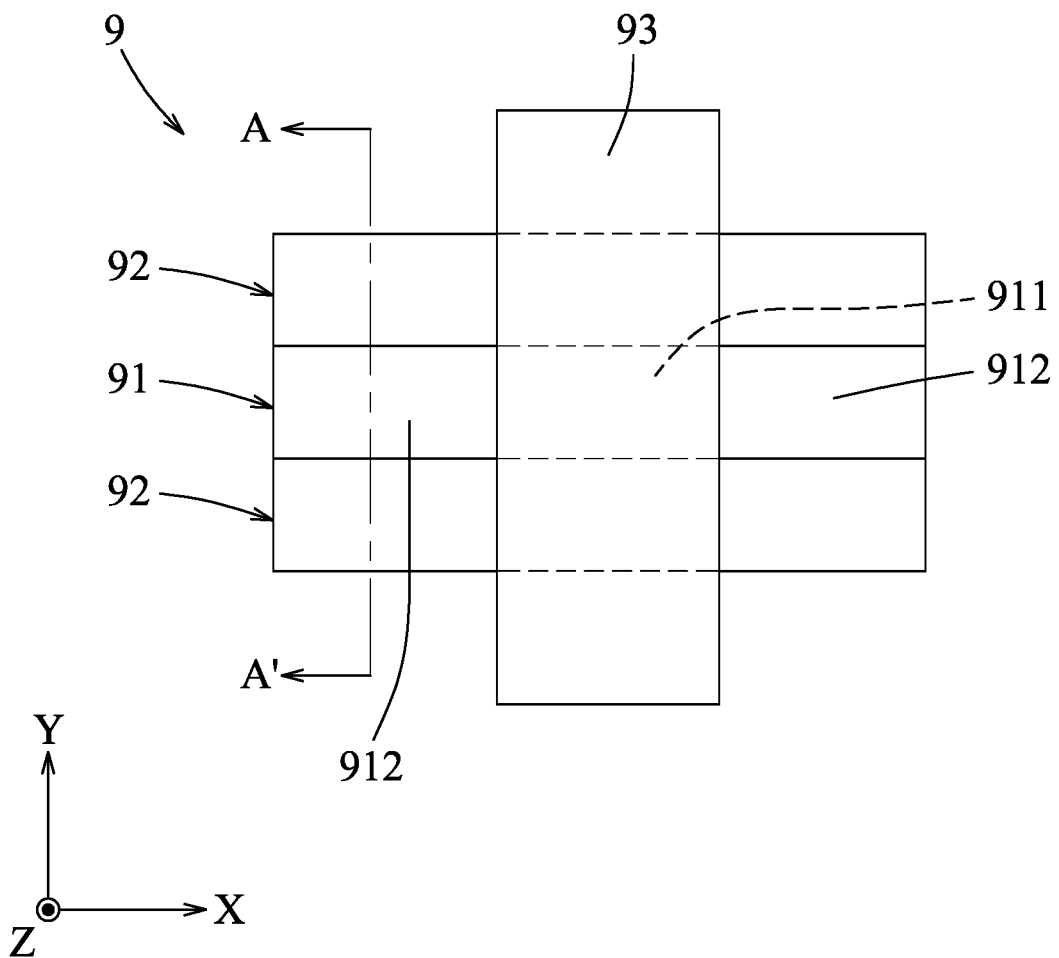
FIG. 2 illustrates a schematic partial top view of a semiconductor unit shown in FIG. 1 in accordance with some embodiments.

FIG. 2 is a schematic partial top view illustrating one of the semiconductor units 9 shown in FIG. 1 in accordance with some embodiments (the elements other than the semiconductor unit 9 are omitted), and the schematic sectional view of any of the semiconductor units 9 shown in FIG. 1 can be obtained along line A-A' of FIG. 2.

As shown in FIGS. 1 and 2, each of the semiconductor units 9 includes a semiconductor fin 91, two dummy fins 92, and a gate feature 93. The semiconductor fin 91 extends along the X direction, and has a middle portion 911 and two recessed portions 912. The middle portion 911 serves as a channel, and the two recessed portions 912 are located at two sides of the middle portion 911 which are opposite in the X direction. At each of the first regions 301, the first source/drain portions 11 are respectively formed on the recessed portions 912 of the corresponding semiconductor unit 9, and are respectively in contact with two ends of the middle portion 911 which are opposite in the X direction. At each of the second regions 302, the second source/drain portions 21 are respectively formed on the recessed portions 912 of the corresponding semiconductor unit 9, and are respectively in contact with two ends of the middle portion 911 which are opposite in the X direction. The materials for the semiconductor fin 91 may be similar to or different from those for the semiconductor substrate 30. In some embodiments, two isolation portions 31 are formed at two sides of the semiconductor fin 91 which are opposite in the Y direction such that the semiconductor fin 91 of each of the semiconductor units 9 is isolated from that of an adjacent one of the semiconductor units 9. The isolation portions 31 may each be a portion of a shallow trench isolation (STI), a deep trench isolation (DTI), or other suitable structures, and are formed in the semiconductor substrate 30. The isolation portions 31 may be made of a dielectric material, such as silicon oxide, silicon nitride, silicon carbide, silicon oxynitride, silicon oxycarbide, silicon carbon nitride, silicon oxygen carbon nitride, hafnium oxide, other suitable dielectric materials, or combinations thereof, but is not limited thereto.

The dummy fins 92 are respectively disposed on the isolation portions 31 to separate the first source/drain portions 11 or the second source/drain portions 21 formed in each of the semiconductor units 9 from those on an adjacent one of the semiconductor units 9. In some embodiments, each of the dummy fins 92 includes a liner 921, a filler 922, and a helmet 923. Each of the liner 921, the filler 922, and the helmet 923 may be independently made of a dielectric material similar to the dielectric materials for the isolation portions 31, and thus details of the possible materials for the liner 921, the filler 922, and the helmet 923 are omitted for the sake of brevity. In some embodiments, a shape of each of the first source/drain portions 11 and the second source/drain portions 21 may be adjusted according to the shape of the dummy fins 92 and the requirement of the electrical performance of the semiconductor structure 1. That is, the shape of each of the first source/drain portions 11 and the second source/drain portions 21 is not limited to that shown in FIG. 1. In some embodiments, each of the first source/drain portions 11 and the second source/drain portions 21 may have a diamond-like shape or an ellipse shape, but is not limited thereto. In some other embodiments, the dummy fins 92 may be omitted, and the first source/drain portions 11 or the second source/drain portions 21 on each of the semiconductor units 9 may be isolated from those on an adjacent one of the semiconductor units 9 by an interlayer dielectric (ILD) layer (not shown). The ILD layer may be made of a dielectric material similar to the dielectric materials for the isolation portion 31, and thus details of the possible materials for the ILD layer are omitted for the sake of brevity.

At each of the first and second regions 301, 302, the gate feature 93 extends in the Y direction, and is disposed over the middle portion 911 such that the first source/drain portions 11 at each of the first regions 301 are exposed from the corresponding semiconductor unit 9 and such that the second source/drain portions 21 at each of the second regions 302 are exposed from the corresponding semiconductor unit 9. In addition, the gate feature 93 is also disposed over a middle portion of each of the dummy fins 92. In the case that the semiconductor structure 1 is a FINFET device, the middle portion 911 of the semiconductor fin 91 may include a channel region, while in the case that the structure 1 is a GAAFET device, the middle portion 911 of the semiconductor fin 91 may include two or more channel regions (not shown) surrounded by the gate feature 93. In some embodiments, the gate feature 93 may include a gate dielectric (not shown) and a gate electrode (not shown), and the gate dielectric is formed on the channel region(s) to separate the channel region(s) from the gate electrode.

In some embodiments, the semiconductor structure 1 further includes first spacers 15 disposed at each of the first regions 301, and second spacers 25 disposed at each of the second regions 302, as shown in FIG. 1. The first spacers 15 or the second spacers 25 are optional, and are often used to protect the dummy fins 92 of a corresponding one of the semiconductor units 9 at the corresponding first region 301 or the corresponding second region 302 from being damaged in subsequent processes, for example, a cleaning process before formation of the first conductive carbon layers 13, or a cleaning process before formation of the first and second metal contacts 12, 22, etc. The first spacers 15 at the corresponding first region 301 are disposed to respectively cover side surfaces of the dummy fins 92 of the corresponding semiconductor unit 9 such that the first upper surface 11s of each of the first source/drain portions 11 has a first exposed portion which is exposed from the first spacers 15 and which a corresponding one of the first conductive carbon layers 13 is disposed thereon. The second spacers 25 at the corresponding second region 302 are disposed to respectively cover side surfaces of the dummy fins 92 of the corresponding semiconductor unit 9 such that the second upper surface 21s of each of the second source/drain portions 21 has a second exposed portion which is exposed from the second spacers 25. Each of the first and second spacers 15, 25 may be independently made of a dielectric material similar to the dielectric material for the isolation portion 31, and thus details of the possible materials for the first and second spacers 15, 25 are omitted for the sake of brevity.

Figure 3:
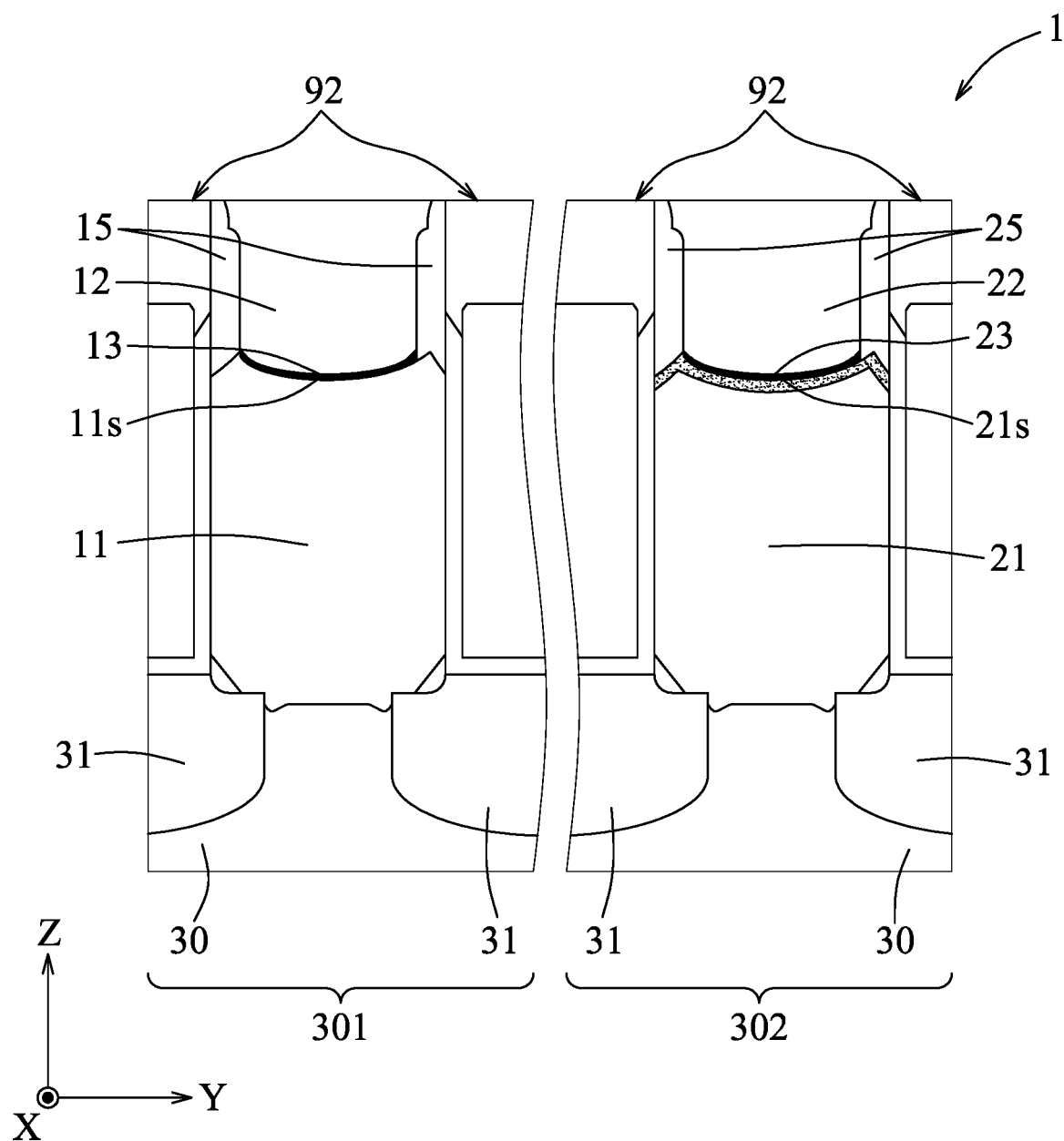
FIG. 3 illustrates a fragmentary schematic sectional view of a semiconductor structure including first and second conductive carbon layers in accordance with some embodiments.

FIG. 3 is a fragmentary schematic sectional view illustrating a semiconductor structure 1 in accordance with some embodiments. Some repeating structures are omitted in FIG. 3 for the sake of brevity. The semiconductor structure 1 shown in FIG. 3 is similar to that shown in FIG. 1, except that, at each of the second regions 302, the semiconductor structure 1 shown in FIG. 3 further includes two second conductive carbon layers 23 (one of which is shown in FIG. 3) each of which is disposed between a corresponding one of the second source/drain portions 21 and a corresponding one of the second metal contacts 22. The materials and thickness of the second conductive carbon layers 23 are similar to those of the first conductive carbon layers 13 as described above, and thus details thereof are omitted for the sake of brevity. In some embodiments, each of the second conductive carbon layers 23 is disposed on the second exposed portion of the second upper surface 21s of a corresponding one of the second source/drain portions 21.

Figure 4:
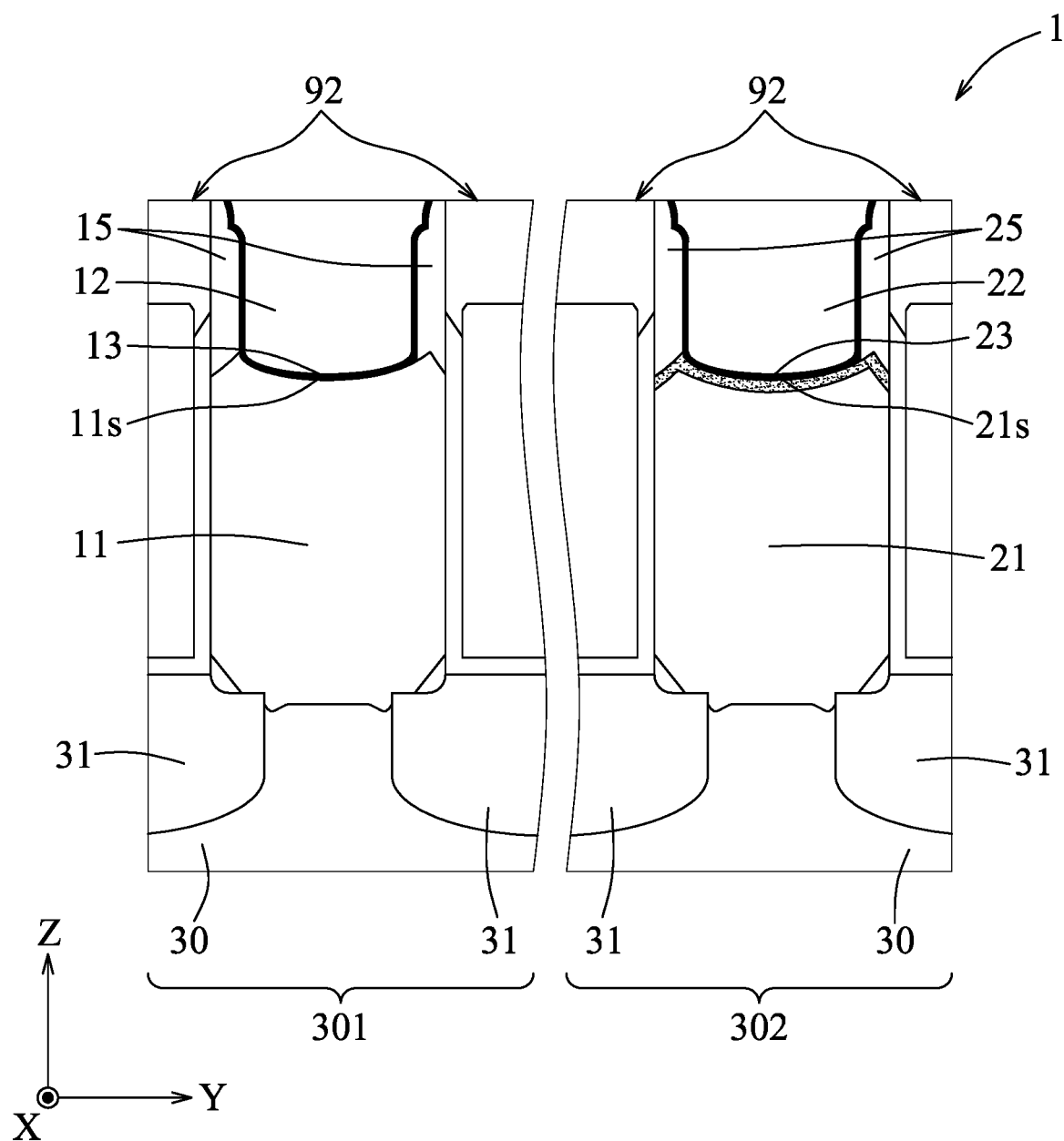
FIG. 4 is a view similar to that of FIG. 3, but illustrating the first and second conductive carbon layers being respectively disposed on first and second spacers in accordance with some embodiments.

FIG. 4 is a fragmentary schematic sectional view illustrating a semiconductor structure 1 in accordance with some embodiments. Some repeating structures are omitted in FIG. 4 for the sake of brevity. The semiconductor structure 1 shown in FIG. 4 is similar to that shown in FIG. 3, except that in the semiconductor structure 1 shown in FIG. 4, each of the first conductive carbon layers (one of which is shown) 13 extends to further cover the first spacers 15, and each of the second conductive carbon layers 23 (one of which is shown) extends to further cover the second spacers 25.

Figure 5:
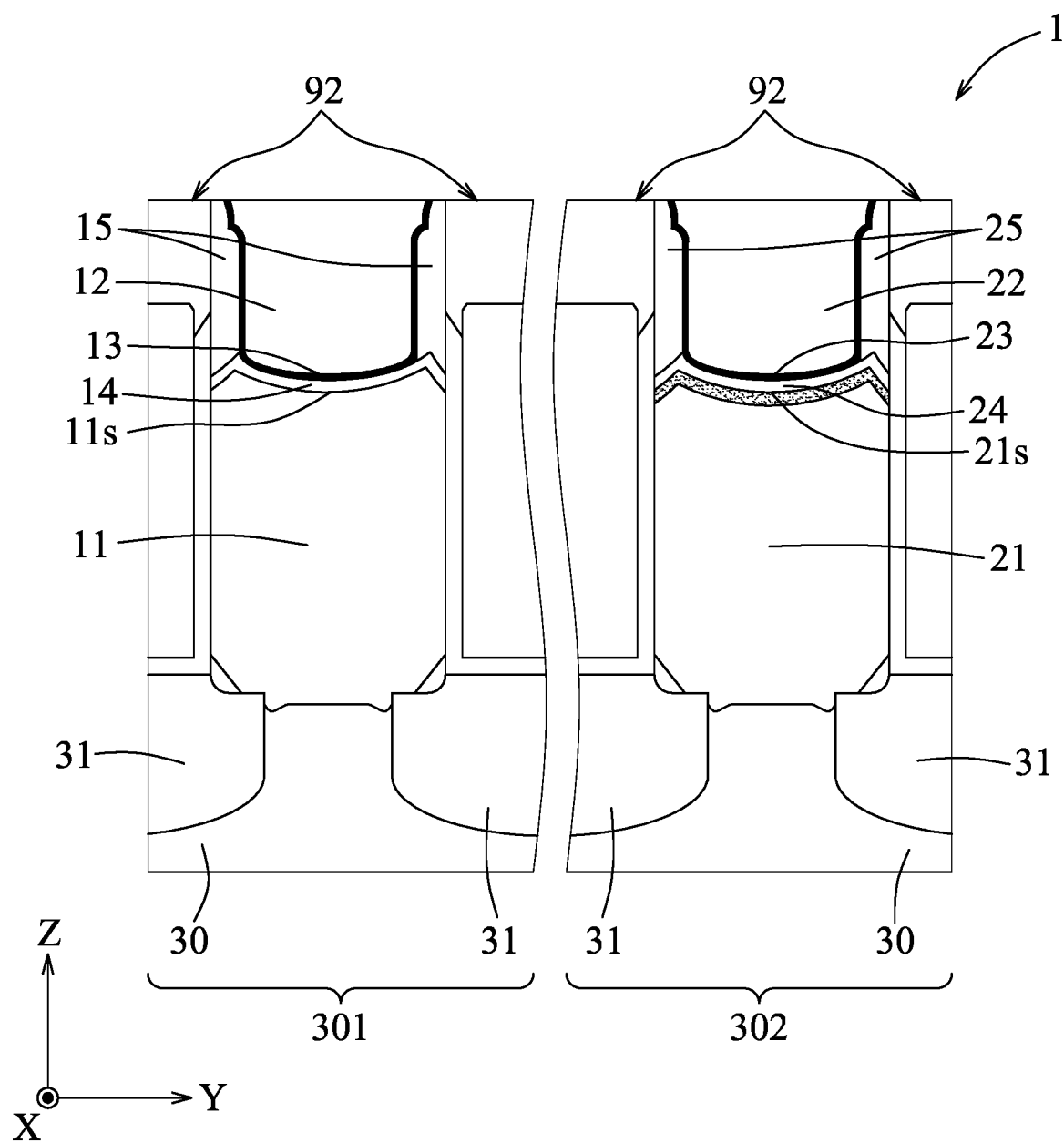
FIG. 5 illustrates a fragmentary schematic sectional view of a semiconductor structure including first and second dipole layers in accordance with some embodiments.

FIG. 5 is a fragmentary schematic sectional view illustrating a semiconductor structure 1 in accordance with some embodiments. Some repeating structures are omitted in FIG. 5 for the sake of brevity. The semiconductor structure 1 shown in FIG. 5 is similar to that shown in FIG. 4, except that the semiconductor structure 1 shown in FIG. 5 further includes two first dipole layers 14 (one of which is shown in FIG. 5) disposed at each of the first regions 301 and two second dipole layers 24 (one of which is shown in FIG. 5) disposed at each of the second regions 302. At each of the first regions 301, each of the first dipole layers 14 is disposed between a corresponding one of the first source/drain portions 11 and a corresponding one of the first conductive carbon layers 13. At each of the second regions 302, each of the second dipole layers 24 is disposed between a corresponding one of the second source/drain portions 21 and a corresponding one of the second conductive carbon layers 23. In some embodiments, at each of the first regions 301, each of the first dipole layers 14 fully covers the first upper surface 11s of the corresponding first source/drain portion 11, as shown in FIG. 5. In some embodiments, at each of the second regions 302, each of the second dipole layers 24 fully covers the second upper surface 21s of the corresponding second source/drain portion 21, as shown in FIG. 5. In the case that the first source/drain portions 11 have an n-type conductivity, the first dipole layers 14 may each include phosphorous (P), arsenic (As), hafnium (Hf), zirconium (Zr), erbium (Er), or combinations thereof. In the case that the second source/drain portions 21 have a p-type conductivity, the second dipole layers 24 may each include boron (B), gallium (Ga), indium (In), scandium (Sc), copper (Cu), nickel (Ni), tungsten (W), ruthenium (Ru), silver (Ag), platinum (Pt), or combinations thereof. In some embodiments, each of the first and second dipole layers 14, 24 has a thickness of at least one atomic layer. In some embodiments, the thickness of each of the first and second dipole layers 14, 24 ranges from 3 Å to 6 Å.

Figure 6:
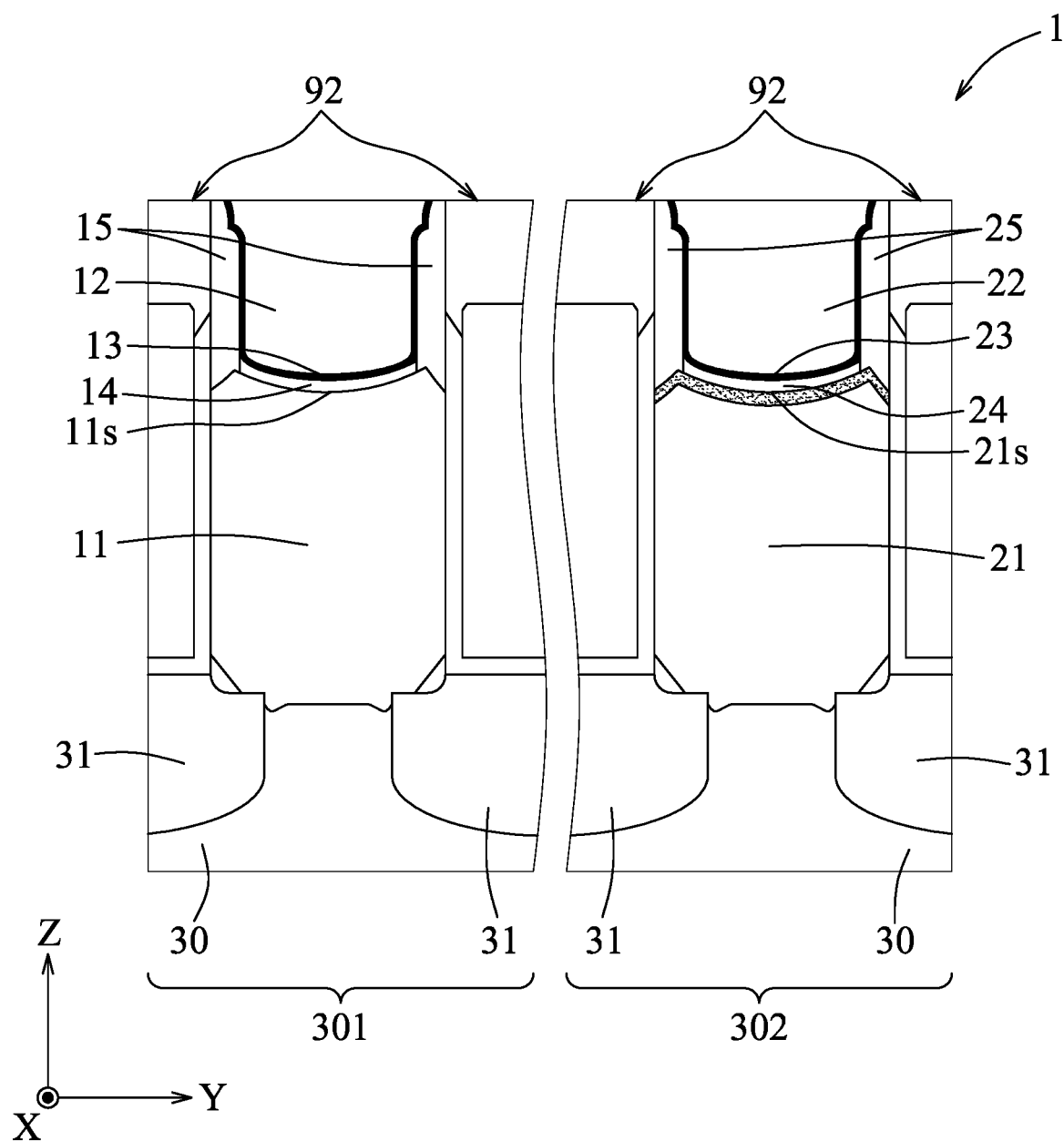
FIG. 6 is a view similar to that of FIG. 5, but illustrating the first and second dipole layers being respectively and partially disposed on first and second source/drain portions in accordance with some embodiments.

FIG. 6 is a fragmentary schematic sectional view illustrating a semiconductor structure 1 in accordance with some other embodiments. Some repeating structures are omitted in FIG. 6 for the sake of brevity. The semiconductor structure 1 shown in FIG. 6 is similar to that shown in FIG. 5, except that, in the semiconductor structure 1 shown in FIG. 6, each of the first dipole layers 14 is disposed on the first exposed portion of the first upper surface 11s of the corresponding first source/drain portion 11, and each of the second dipole layers 24 is disposed on the second exposed portion of the second upper surface 21s of the corresponding second source/drain portion 21.

Figure 7:
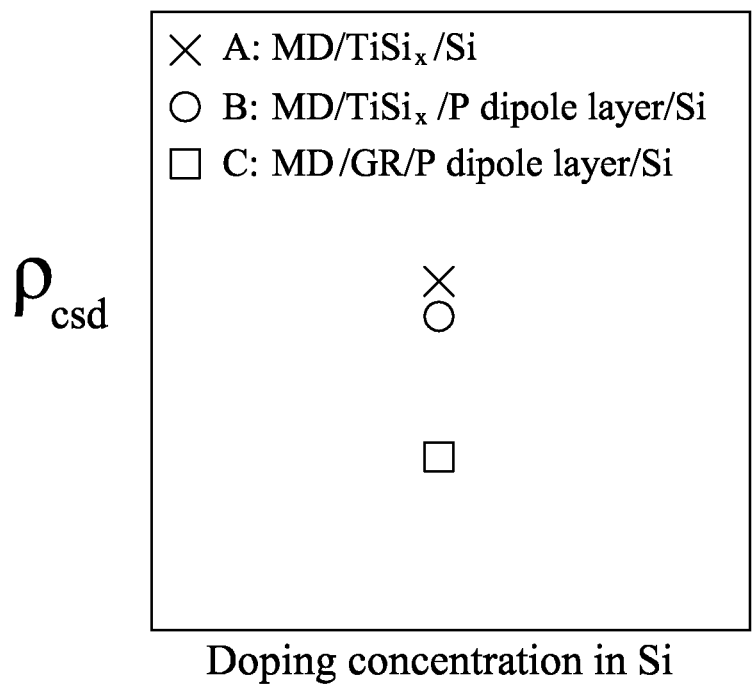
FIG. 7 is a graph illustrating relationship of source/drain contact resistivity (ρcsd) versus bulk doping concentration of an n-type source/drain portion in accordance with some embodiments.

FIG. 7 is a graph illustrating relationship of source/drain contact resistivity ($\rho$csd) versus bulk doping concentration of an n-type source/drain portion in accordance with some embodiments. The source/drain contact resistivity ($\rho$csd) is a specific contact resistivity between an n-type source/drain portion and a metal contact. In FIG. 7, as well as FIGS. 8 to 13, the metal contact is represented by "MD." In FIG. 7, the metal contact in each of Samples A to C may be made of cobalt (Co), ruthenium (Ru), tungsten (W), molybdenum (Mo), or alloys thereof, and the n-type source/drain portions in Samples A to C have the same bulk doping concentration and each is made of silicon doped with an n-type impurity. The relationship between Rcsd and $\rho$csd is represented by an equation of Rcsd=$\rho$csd/A, where A is a contact area between the n-type source/drain portion and the metal contact. Sample A includes the metal contact, the n-type source/drain portion and a titanium silicide ($TiSi_x$) layer formed between the metal contact and the n-type source/drain portion. Sample B has a structure similar to that of Sample A except that Sample B further includes a dipole layer which is interposed between the $TiSi_x$ layer and the n-type source/drain portion, and which is made of phosphorous (P) (hereinafter, the dipole layer is referred to as a P dipole layer). Sample C has a structure similar to that of Sample B except that, in Sample C, the $TiSi_x$ layer in Sample B is replaced by a conductive carbon layer made of graphene (GR) (hereinafter, the conductive carbon layer is referred to as a GR layer). It can be seen in FIG. 7 that Sample B has a $\rho$csd lower than that of Sample A, and that Sample C has a $\rho$csd greatly lower than that of Sample B. Therefore, it can be concluded that introduction of the P dipole layer and/or the GR layer is effective on reduction of $\rho$csd even in the absence of the $TiSi_x$ layer. Without being limited to any one theory, it is believed that in Sample C, the GR layer is bonded to adjacent materials (e.g., the metal contact and the P dipole layer) by van der Waals force, and thus the Fermi level pinning effect in Sample C can be alleviated. Therefore, the introduction of the P dipole layer and the GR layer may effectively reduce a Schottky barrier height (SBH) at a metal-semiconductor junction (for example, a junction between the metal contact and the n-type source/drain portion). Moreover, the regular atomic arrangement (i.e., lattice match) between the GR layer and the metal contact may facilitate transfer of electrons, thereby further reducing the $\rho$csd. Based on the results shown in FIG. 7, it is believed that when (i) the P dipole layer is replaced by any other suitable materials for the first dipole layers 14, (ii) the n-type source/drain portion is replaced by any other suitable materials for the first source/drain portions 11, and (iii) the metal contact is replaced by any other suitable materials for the first metal contacts 12, the $\rho$csd reduction effect may also be achieved.

Figure 8:
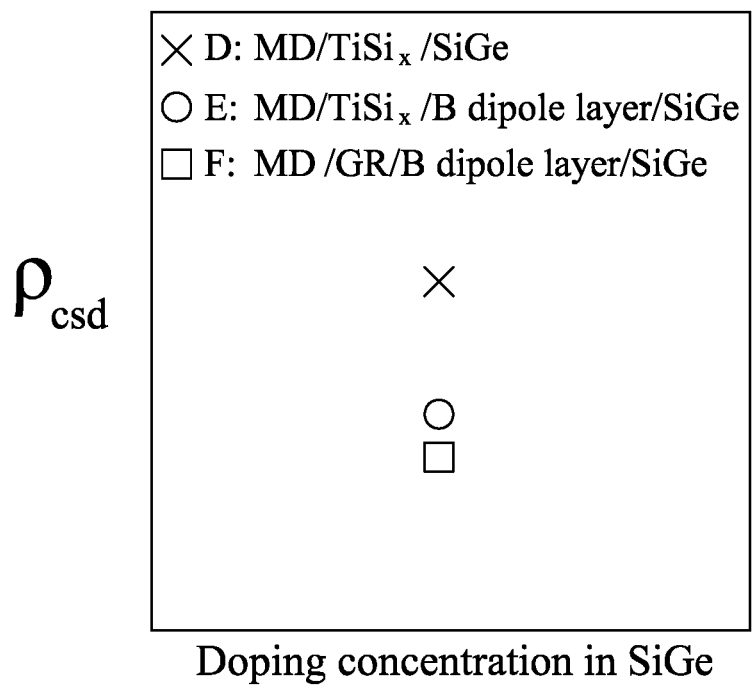
FIG. 8 is a graph illustrating relationship of ρcsd versus bulk doping concentration of a p-type source/drain portion in accordance with some embodiments.

FIG. 8 is a graph illustrating relationship of $\rho$csd versus bulk doping concentration of a p-type source/drain portion in accordance with some embodiments. In FIG. 8, the $\rho$csd is a specific contact resistivity between a p-type source/drain portion and a metal contact. The metal contact in each of Samples D to F may be made of cobalt (Co), ruthenium (Ru), tungsten (W), molybdenum (Mo), or alloys thereof. In addition, the p-type source/drain portions in Samples D to F have the same bulk doping concentration and each is made of SiGe doped with a p-type impurity. Sample D includes the metal contact, the p-type source/drain portion and a titanium silicide (TiSi$_x$) layer formed between the metal contact and the p-type source/drain portion. Sample E has a structure similar to that of Sample D except that Sample E further includes a dipole layer which is interposed between the TiSi$_x$ layer and the p-type source/drain portion, and which is made of boron (B) (hereinafter, the dipole layer is referred to as a B dipole layer). Sample F has a structure similar to that of Sample E expect that in Sample F, the TiSi$_x$ layer of Sample E is replaced by a GR layer. It can be seen in FIG. 8 that Sample E has a ρcsd greatly lower than that of Sample D, and that Sample F has a ρcsd even lower than that of Sample E. Therefore, it can be concluded that introduction of the B dipole layer and/or the GR layer is effective on reduction of ρcsd even in the absence of the TiSi$_x$ layer. Similar to the description related to FIG. 7, the B dipole layer and/or the GR layer may be effective in alleviating Fermi level pinning effect. Based on the results shown in FIG. 8, it is believed that when (i) the B dipole layer is replaced by any other suitable materials for the second dipole layers 24, (ii) the p-type source/drain portion is replaced by any other suitable materials for the second source/drain portions 21, and (iii) the metal contact is replaced by any other suitable materials for the second metal contacts 22, the ρcsd reduction effect may also be achieved.

Figure 9:
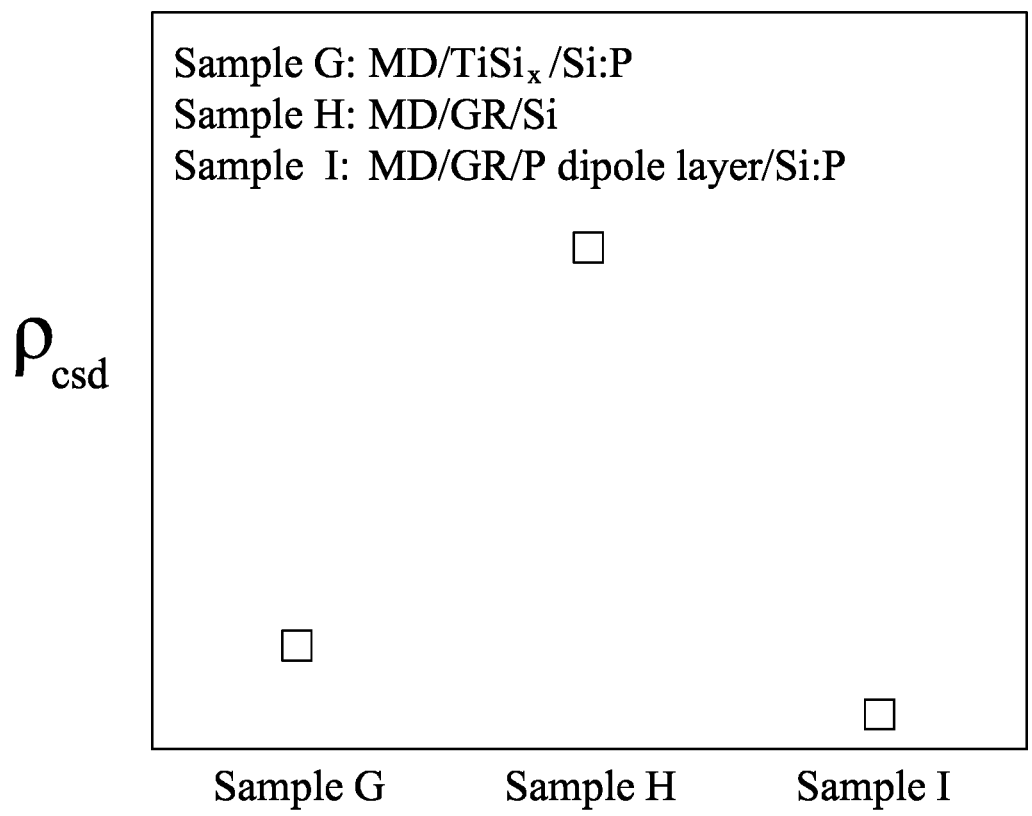
FIG. 9 is a graph illustrating relationship of ρcsd versus samples G, H and I in accordance with some embodiments.

FIG. 9 is a graph illustrating relationship of ρcsd versus Samples G, H and I in accordance with some embodiments. In FIG. 9, the ρcsd is a specific contact resistivity between an n-type source/drain portion and a metal contact. The metal contact in each of Samples G to I may be made of cobalt (Co), ruthenium (Ru), tungsten (W), molybdenum (Mo), or alloys thereof. Sample G includes the metal contact, an n-type source/drain portion made of silicon doped with an n-type impurity (e.g., phosphorous (P)), and a titanium silicide (TiSi$_x$) layer disposed between the metal contact and the n-type source/drain portion. Sample H has a structure similar to Sample G except that the in Sample H, (i) the TiSi$_x$ layer in Sample G is replaced by a GR layer, and (ii) the n-type source/drain portion in Sample G is replaced by an intrinsic source/drain portion (without being doped). Sample I has a structure similar to that of Sample H except that in Sample I, (i) the intrinsic source/drain portion of Sample H is replaced by the n-type source/drain portion of Sample G, and (ii) a P dipole layer is interposed between the GR layer and the n-type source/drain portion. It can be seen in FIG. 9 that Sample H has a ρcsd higher than that of Sample G, and that Sample I has a ρcsd lower than that of Sample G. Therefore, introduction of the GR layer and the P dipole layer can effectively reduce the ρcsd.

Figure 10:
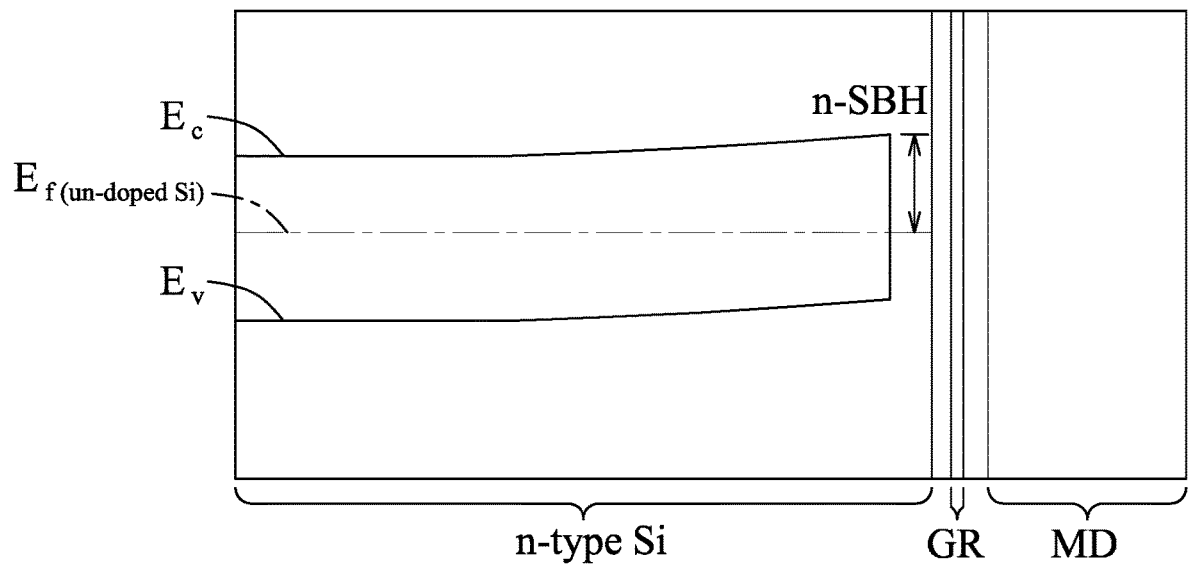
FIGS. 10 and 11 respectively illustrate band diagrams for sample J without a dipole layer and sample K with a dipole layer in accordance with some embodiments.
Figure 11:
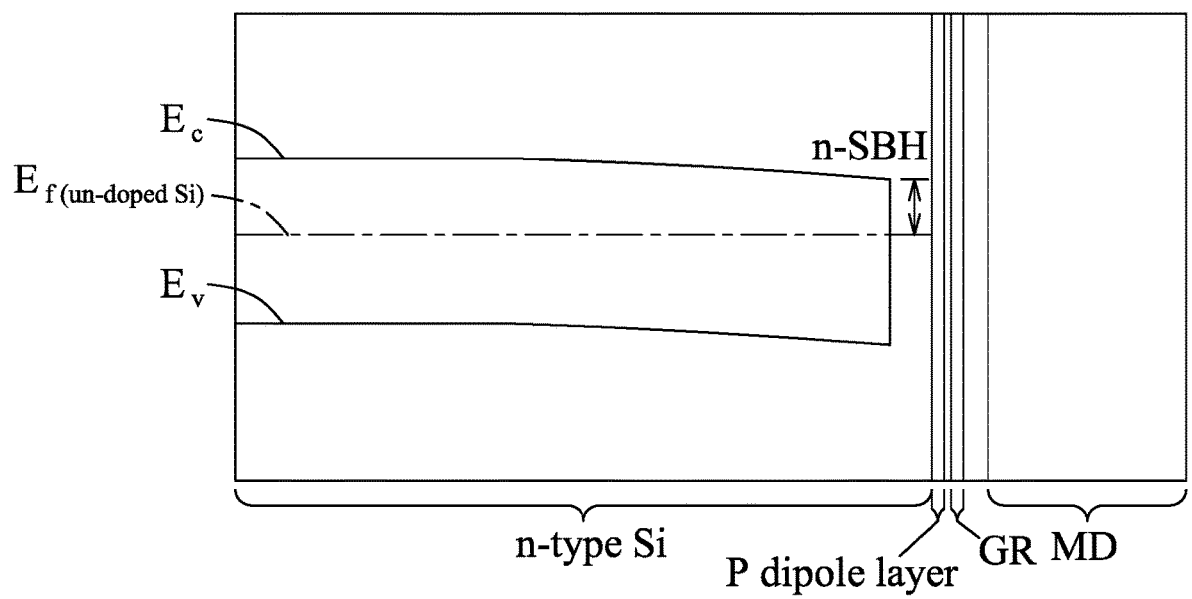

FIGS. 10 and 11 respectively illustrates band diagrams for Sample J without a dipole layer and Sample K with a P dipole layer in accordance with some embodiments. Sample J includes an n-type source/drain portion made of silicon doped with an n-type impurity, a metal contact, and a GR layer interposed between the n-type source/drain portion and the metal contact. The metal contact in Sample J may be made of cobalt (Co), ruthenium (Ru), tungsten (W), molybdenum (Mo), or alloys thereof. Sample K has a structure similar to that of Sample J except that in Sample K, the P dipole layer is interposed between the GR layer and the n-type source/drain portion. It can be seen in FIGS. 10 and 11 that in the presence of the GR layer at a metal-semiconductor junction (i.e., a junction between the metal contact and the n-type source/drain portion), the conduction band edge (Ec) and the valence band edge (Ev) of the n-type source/drain portion are remarkably bended to a lower energy level at the metal-semiconductor junction by the presence of the P dipole layer, and an n-SBH, which is a difference between Fermi level of an intrinsic silicon (E$_{f\,(undoped\ Si)}$) and conduction band edge (Ec) of the n-type source/drain portion at the metal-semiconductor junction, is reduced, thereby resulting in a lower ρcsd in an n-FET.

Figure 12:
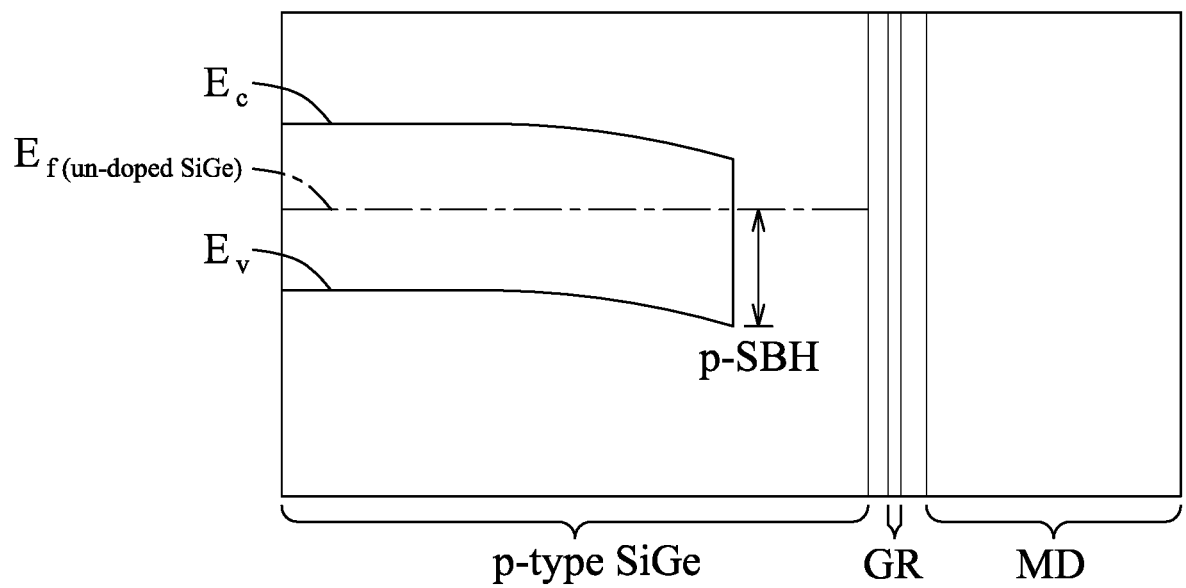
FIGS. 12 and 13 respectively illustrate band diagrams for sample L without a dipole layer and sample M with a dipole layer in accordance with some embodiments.
Figure 13:
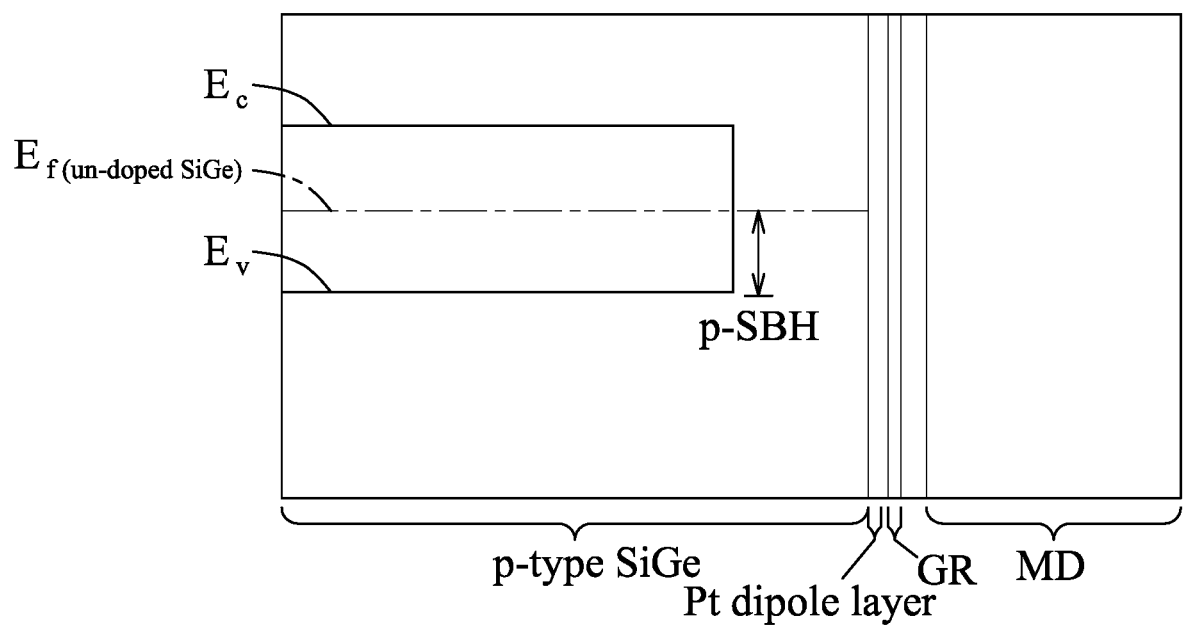

FIGS. 12 and 13 respectively illustrate band diagrams for Sample L without a dipole layer and Sample M with a dipole layer which is made of platinum (hereinafter, the dipole layer is referred to as a Pt dipole layer) in accordance with some embodiments. The sample L includes a p-type source/drain portion made of SiGe doped with a p-type impurity, a metal contact, and a GR layer interposed between the p-type source/drain portion and the metal contact. The metal contact in Sample L may be made of cobalt (Co), ruthenium (Ru), tungsten (W), molybdenum (Mo), or alloys thereof. Sample M has a structure similar to that of Sample L except that in Sample M, the Pt dipole layer is interposed between the GR layer and the p-type source/drain portion. It can be seen that in the presence of the GR layer at a metal-semiconductor junction (i.e., a junction between the metal contact and the p-type source/drain portion), band bending of the conduction band edge (Ec) and band bending of the valence band edge (Ev) of the p-type source/drain portion are remarkably decreased by the presence of the Pt dipole layer, and a p-SBH, which is a difference between Fermi level of an intrinsic silicon germanium (E$_{f(undoped\ SiGe)}$) and valence band edge (Ev) of the p-type source/drain portion at the metal-semiconductor junction, is reduced, thereby resulting in a lower ρcsd in a p-FET.

In some alternative embodiments, the semiconductor structure 1 may further include additional features, and/or some features present in the semiconductor structure 1 may be modified, replaced, or eliminated without departure from the spirit and scope of the present disclosure.

In the presence of a conductive carbon layer which has a Fermi level de-pinning effect, and with the provision of a dipole layer interposed between the conductive carbon layer and a metal contact, Rcsd can be effectively reduced. The dipole layer may be formed before or after the formation of a dielectric layer (e.g., before or after forming an interlayer dielectric (ILD) layer 50 shown in FIG. 14). In the following, a method for manufacturing the semiconductor structure 1 where the dipole layer is formed before the formation of the dielectric layer is illustrated, although in some alternative embodiments, the dipole layer may be formed after the formation of the dielectric layer.

Figure 14:
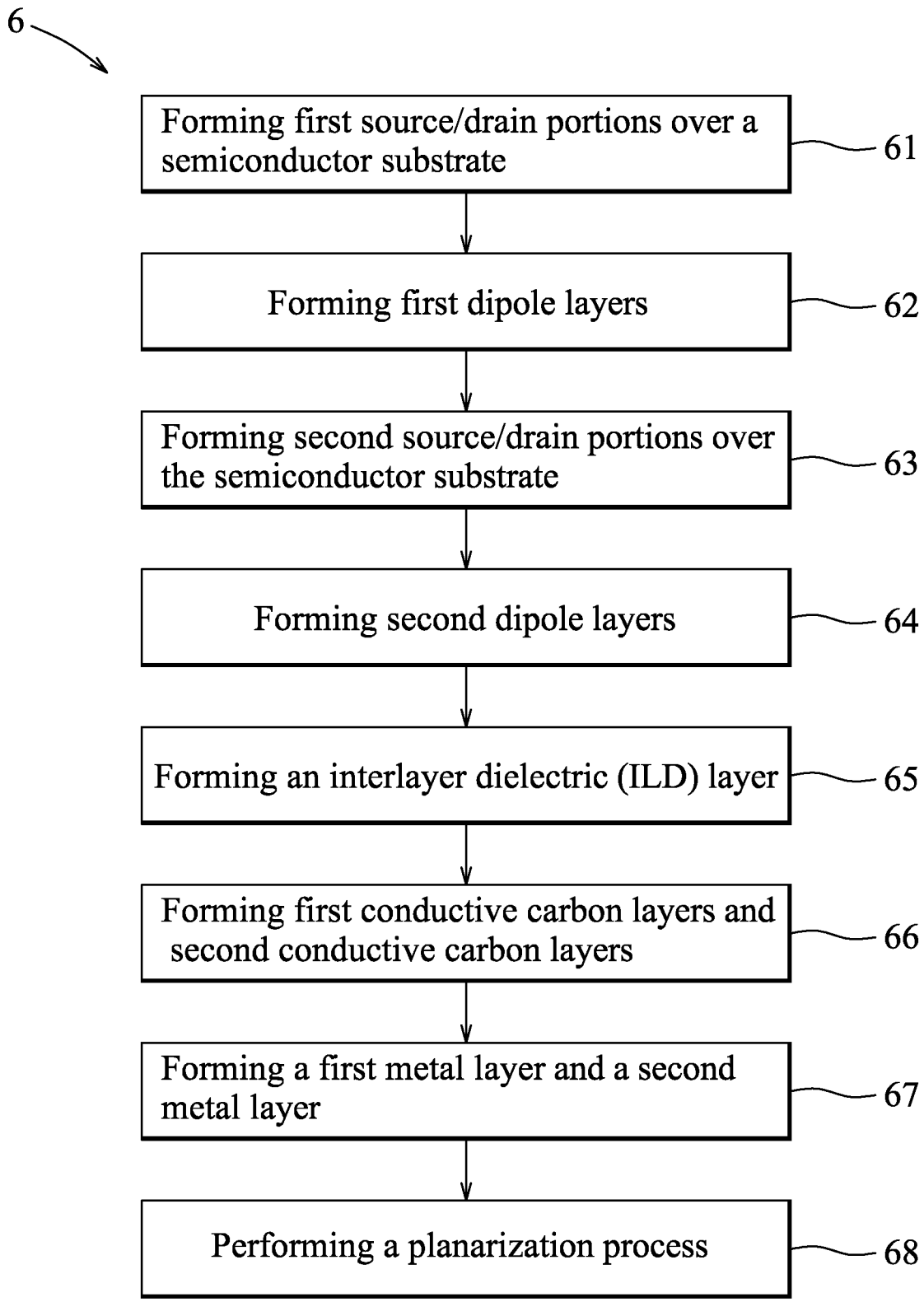
FIG. 14 is a flow diagram illustrating a method for manufacturing the semiconductor structure shown in FIG. 5 in accordance with some embodiments.

FIG. 14 is a flow diagram illustrating a method 6 for manufacturing a semiconductor structure (for example, but not limited to, the semiconductor structure 1 shown in FIG. 5) in accordance with some embodiments. FIGS. 15 to 22 illustrate schematic views of the intermediate stages of the method 6 in accordance with some embodiments. Similar numerals from the above-mentioned embodiments are used where appropriate, with some construction differences being indicated with different numerals.

Figure 15:
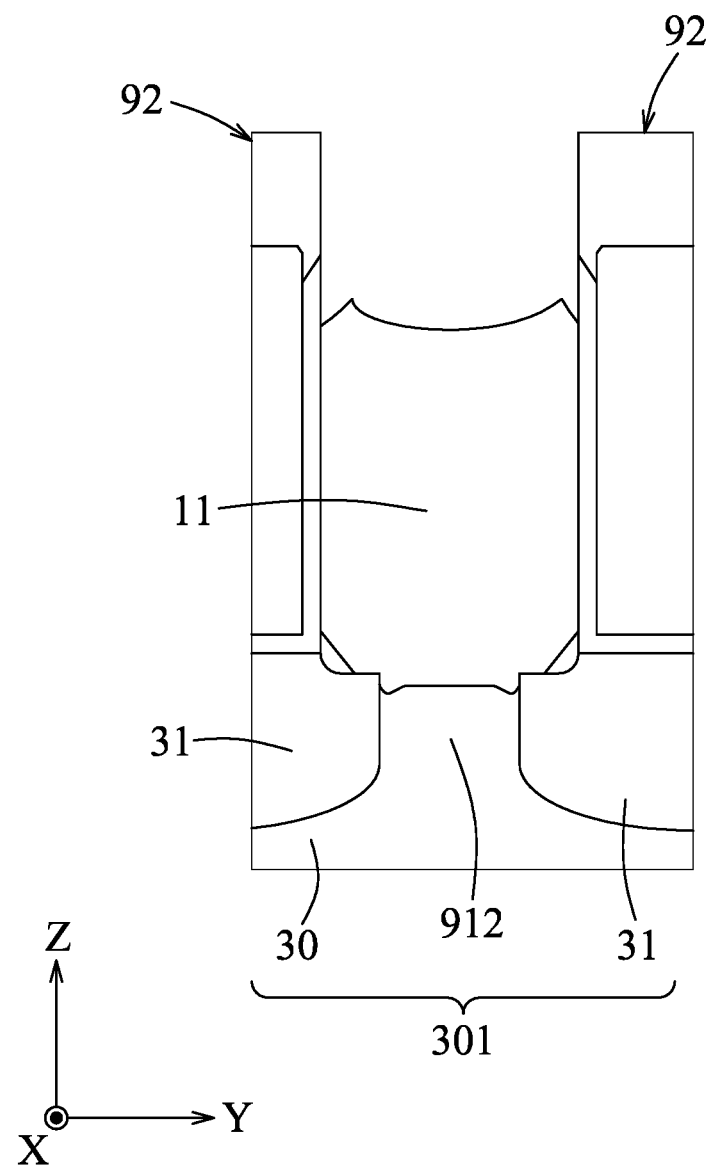
FIGS. 15 to 22 are schematic views illustrating intermediate stages of the method depicted in FIG. 14 in accordance with some embodiments.

Referring to FIG. 14 and the examples illustrated in FIG. 15, the method 6 begins at step 61, where the two first source/drain portions 11 (the two first source/drain portions 11 are opposite in the X direction, and one of the first source/drain portions 11 is shown) are formed over each of the first regions 301 (one of which is shown) of the semiconductor substrate 30. In FIG. 15, the second regions 302 of the semiconductor substrate 30 and the elements thereon are omitted. In some embodiments, at each of the first regions 301, the two first source/drain portions 11 are formed respectively on the recessed portions 912 and between the dummy fins 92 (see also FIG. 2). In some embodiments, the first source/drain portion 11 may be formed by a selective epitaxial growth (SEG) process, and may be in-situ doped with the n-type impurity as described above during the SEG process, but is not limited thereto. Other suitable techniques for forming the first source/drain portions 11 are within the contemplated scope of disclosure. In some embodiments, before the epitaxial growth of the first source/drain portions 11, a patterned masking layer (e.g., a patterned hard mark or a patterned photoresist, not shown) may be formed by a suitable deposition process, followed by a lithography process to expose the recessed portions 912 on each of the first regions 301. In some embodiments, after the epitaxial growth of the first source/drain portions 11, the first source/drain portions 11 may be further trimmed for obtaining a desirable electrical performance, and the trimming of the first source/drain portions 11 may involve an etching process, for example, isotropic wet etching, anisotropic dry etching, other suitable techniques, or combinations thereof. Since the materials for the first source/drain portions 11 are as described above, details thereof are omitted for the sake of brevity.

Figure 16:
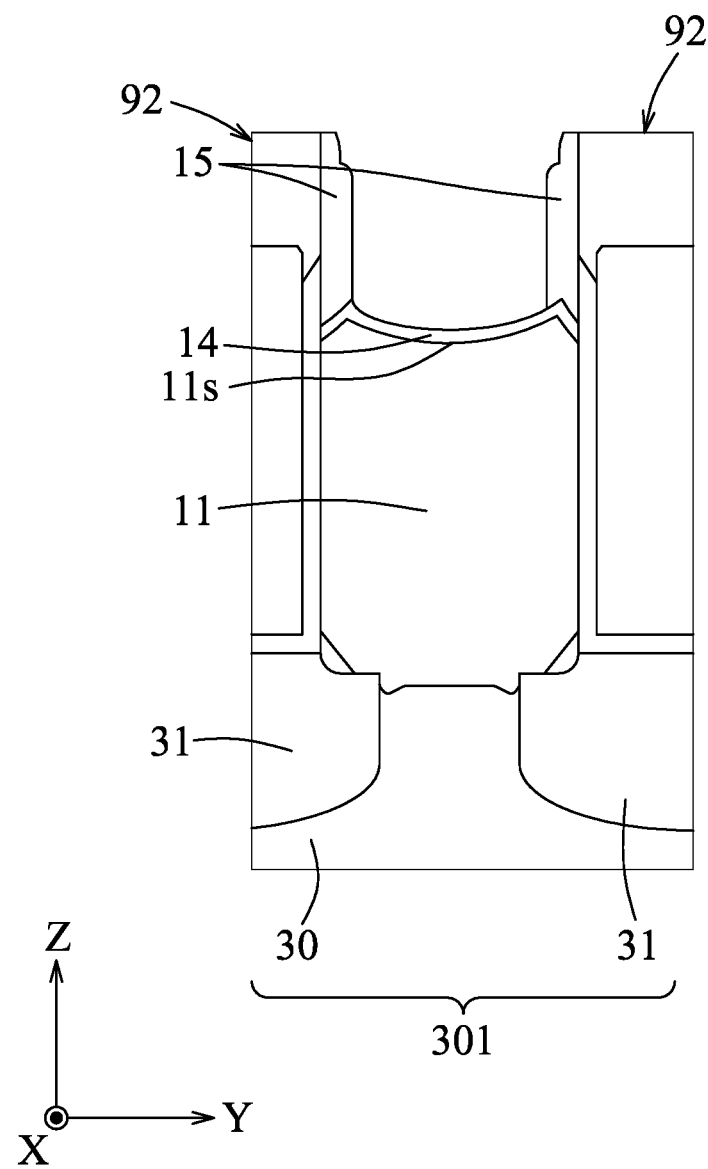

Referring to FIG. 14 and the examples illustrated in FIG. 16, the method 6 proceeds to step 62, where the two first dipole layers 14 (one of which is shown) are formed to fully and respectively cover the first upper surfaces 11s of the first source/drain portions 11 at each of the first regions 301. In FIG. 16, the second regions 302 of the semiconductor substrate 30 and the elements thereon are omitted. In some embodiment, step 62 may be performed by a deposition process, for example, chemical vapor deposition (CVD), plasma-enhanced chemical vapor deposition (PECVD), physical vapor deposition (PVD), atomic layer deposition (ALD), or implantation, but is not limited thereto. Other suitable techniques for forming the first dipole layers 14 are within the contemplated scope of the disclosure. Since the materials and thickness for the first dipole layers 14 are as described above, details thereof are omitted for the sake of brevity.

In some embodiments, after deposition of the first dipole layers 14, the first spacers 15 may be formed on the side surfaces of the two dummy fins 92 at the corresponding first region 301. In some embodiments, the formation of the first spacers 15 includes the sub-steps of: (i) forming a first spacer layer (not shown) which is used for forming the first spacer 15 so as to cover the dummy fins 92 and the first dipole layers 14 at the corresponding first region 301 using CVD, PECVD, PVD, ALD or other suitable deposition techniques; and (ii) selectively etching the first spacer layer using, for example, but not limited to, an anisotropic etching process. Other suitable techniques for forming the first spacers 15 are within the contemplated scope of the disclosure. In some embodiments, before formation of the first spacers 15, the first dipole layers 14 may each have a relatively larger thickness, and thus during formation of the first spacers 15, the first dipole layers 14 may each be etched to have a predetermined thickness, such as a thickness of at least one atomic layer. After formation of the first spacers 15, the patterned masking layer formed in step 61 may be removed.

Figure 17:
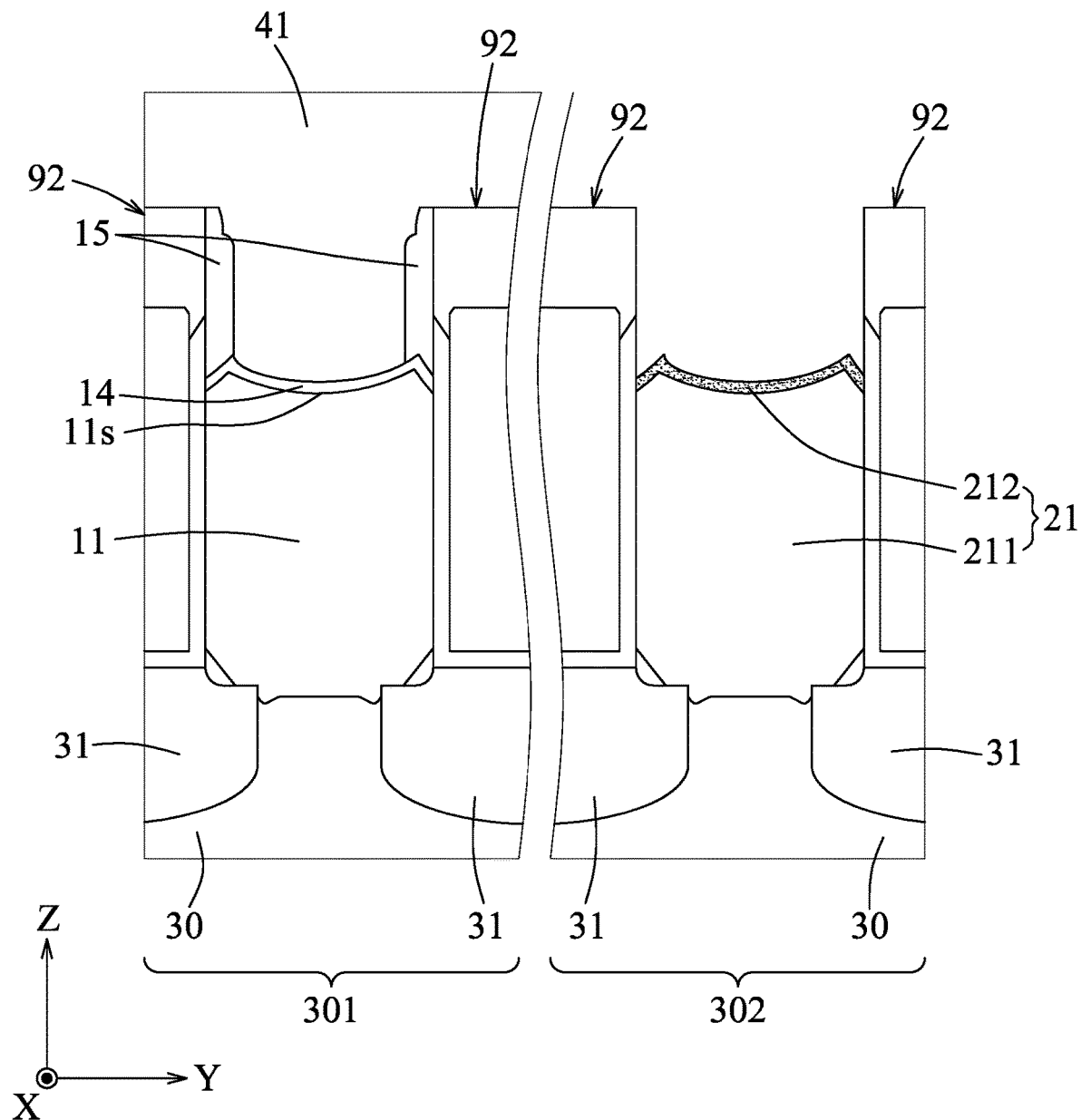

Referring to FIG. 14 and the examples illustrated in FIG. 17, the method 6 proceeds to step 63, where the two second source/drain portions 21 (the two second source/drain portions 21 are opposite in the X direction, and one of the second source/drain portions 21 is shown) are formed over each of the second regions 302 (one of which is shown) of the semiconductor substrate 30. In some embodiments, at each of the second regions 302, the second source/drain portions 21 may be formed respectively on the recessed portions 912 and between the dummy fins 92. In some embodiments, the second source/drain portions 21 may be formed by a SEG process, and may be in-situ doped with the p-type impurity as described above during the SEG process, but is not limited thereto. Other suitable techniques for forming the second source/drain portions 21 are within the contemplated scope of disclosure. In some embodiments, before the epitaxial growth of the second source/drain portions 21, a first patterned mark layer 41 (e.g., a patterned hard mask or a patterned photoresist) may be formed on the first source/drain portions 11 at each of the first regions 301 by a suitable deposition process, followed by a lithography process to expose the recessed portions 912 on each of the second regions 302. In some embodiments, after the epitaxial growth of the second source/drain portions 21, the second source/drain portions 21 may be further trimmed to obtain a desirable electrical performance, and the trimming of the second source/drain portions 21 may involve an etching process, for example, isotropic wet etching, anisotropic dry etching, or a combination thereof. In some embodiments, after the trimming of the second source/drain portions 21, the second source/drain portions 21 may each be further implanted with germanium (Ge) such that the upper part 212 may have a higher concentration of Ge than that of the main part 211 so as to achieve a lower Rscd.

Figure 18:
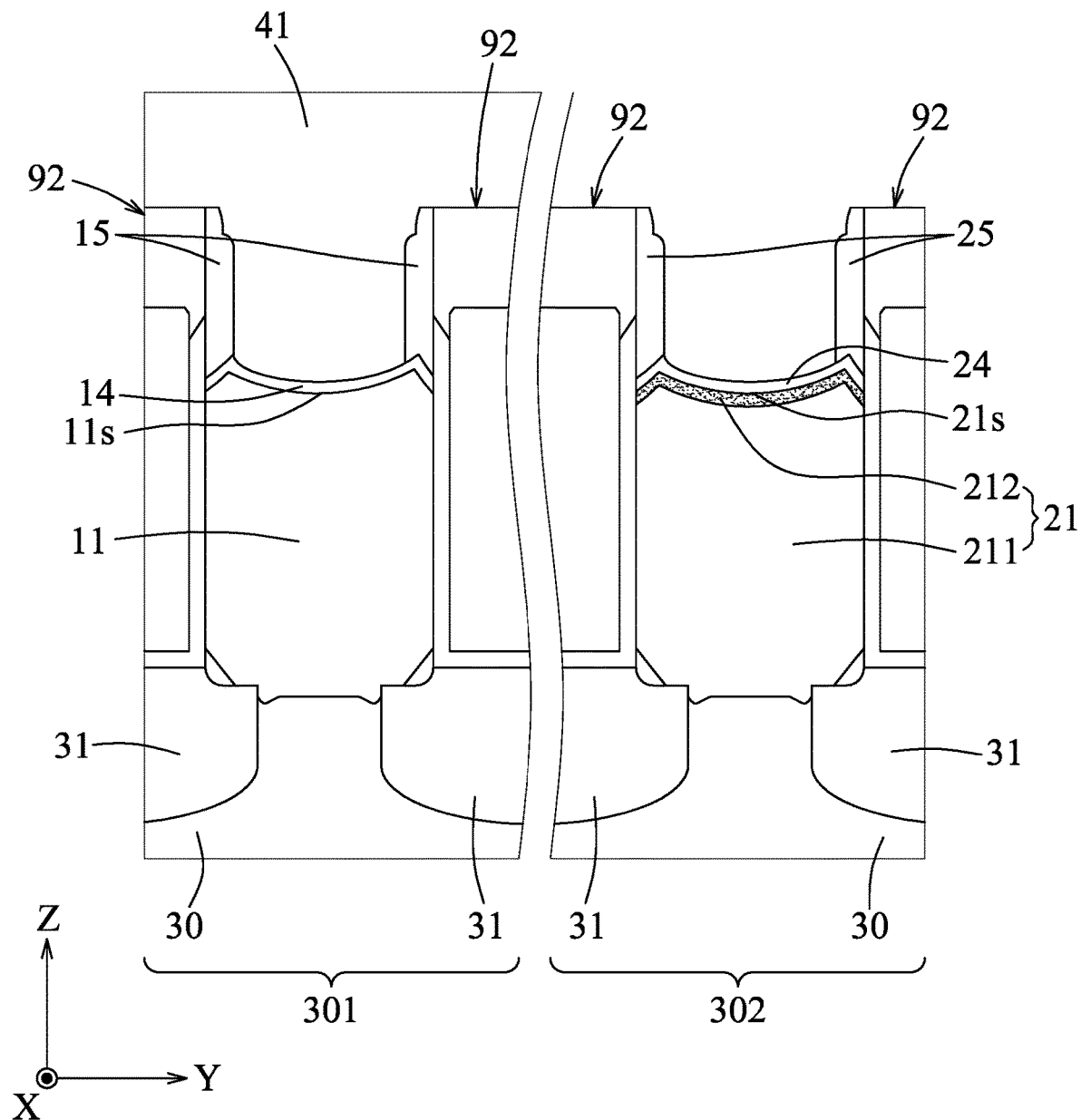

Referring to FIG. 14 and the examples illustrated in FIG. 18, the method 6 proceeds to step 64, where the two second dipole layers 24 (one of which is shown) are formed to fully and respectively cover the second upper surfaces 21s of the second source/drain portions 21 at each of the second regions 302. In some embodiments, step 64 may be performed by a deposition process, for example, CVD, PECVD, PVD, ALD, implantation, but is not limited thereto. Other suitable techniques for forming the second dipole layer 24 are within the contemplated scope of the disclosure. Since the materials and thickness for the second dipole layers 24 are as described above, details thereof are omitted for the sake of brevity.

In some embodiments, after deposition of the second dipole layers 24, the second spacers 25 may be formed on the side surfaces of the two dummy fins 92 at the corresponding second region 302. The formation of the second spacers 25 is similar to that of the first spacers 15, and thus details thereof are omitted for the sake of brevity. Similarly, in some embodiments, before formation of the second spacers 25, the second dipole layers 24 may each have a relatively larger thickness, and thus during formation of the second spacers 25, the second dipole layers 24 may each be etched to have a predetermined thickness, such as a thickness of at least one atomic layer. Other suitable techniques for forming the second spacers 25 are within the contemplated scope of the disclosure. After formation of the second spacers 25, the first patterned mark layer 41 is removed. In some embodiments, the first and second spacers 15, 25 may be formed simultaneously after formation of the first and second dipole layers 14, 24. Since the materials for the first and second spacers 15, 25 are as described above, details thereof are omitted for the sake of brevity.

Figure 19:
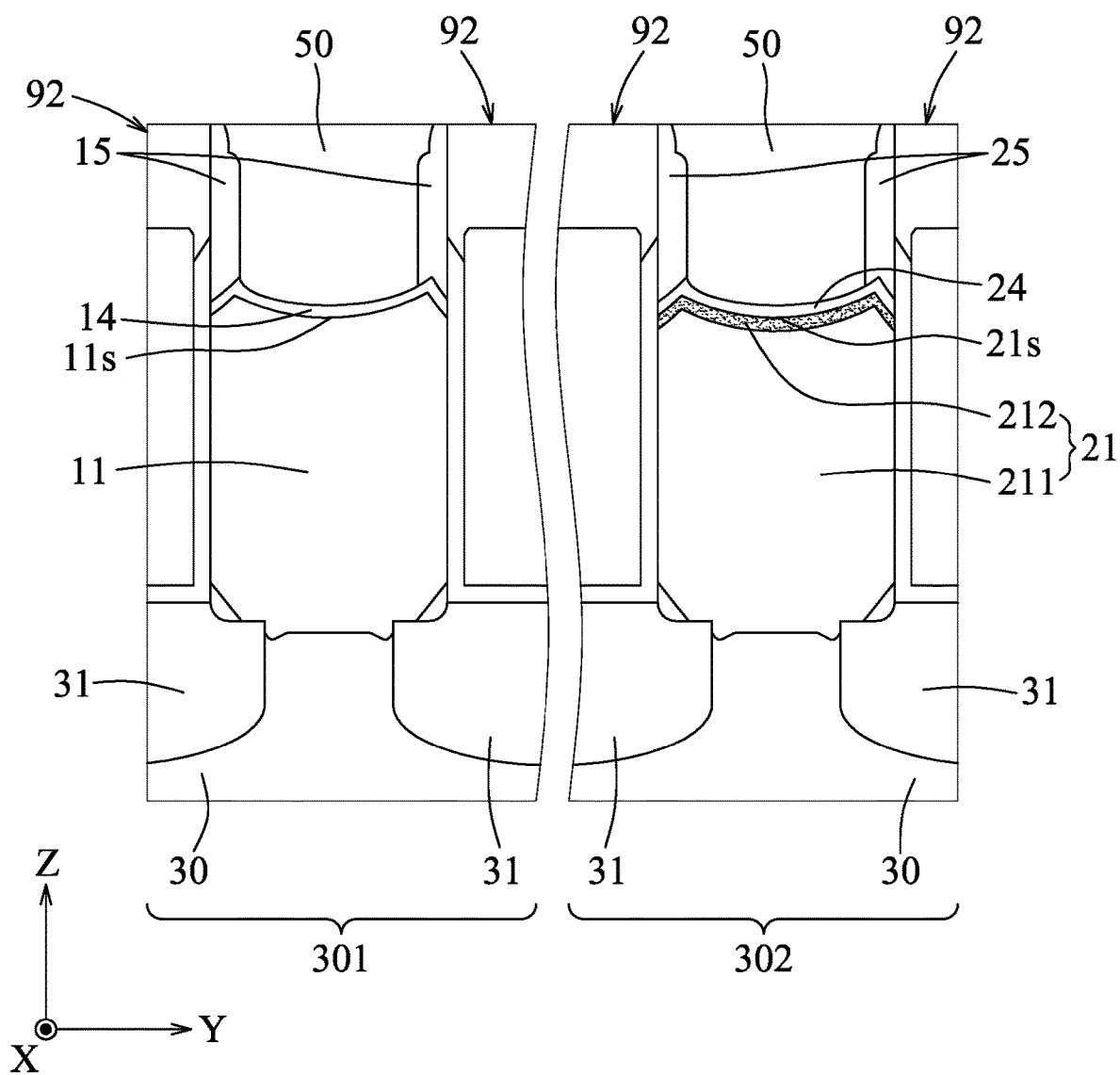

Referring to FIG. 14 and the examples illustrated in FIG. 19, the method 6 proceeds to step 65, where the ILD layer 50 is formed over the first and second dipole layers 14, 24.

The ILD layer 50 may be made of a dielectric material similar to the dielectric materials for the isolation portions 31, and thus details of the possible materials for the ILD layer 50 are omitted for the sake of brevity. In some embodiments, the formation of the ILD layer 50 includes (i) forming a dielectric layer for forming the ILD layer 50 over the dummy fins 92 at each of the first and second regions 301, 302, the first dipole layers 14 at each of the first regions 301 and the second dipole layers 15 at each of the second regions 302, and (ii) performing a planarization process, for example, but not limited to, chemical mechanical planarization (CMP), so as to remove an excess of the dielectric layer and to expose the dummy fins 92 at each of the first and second regions 301, 302. Other suitable processes for formation of the ILD layer 50 are within the contemplated scope of the disclosure.

In some embodiments, after formation of the ILD layer 50, a gate replacement process may be performed for forming the gate feature 93 at each of the first and second regions 301, 302 (see FIGS. 2 and 19). Since the first and second dipole layers 14, 24 and the first and second source/drain portions 11, 21 are protected by the ILD layer 50 during the gate replacement process, the gate replacement process is not directly related to the first and second dipole layers 14, 24 formed in steps 62 and 64 and the first and second conductive carbon layers 13, 23 formed in step 66 after the gate replacement process. Therefore, details for the gate replacement process are omitted for the sake of brevity.

In some embodiments, after the gate replacement process, the ILD layer 50 is at least partially removed to expose the first and second dipole layers 14, 24 respectively at the first and second regions 301, 302. In some other embodiments, after the gate replacement process, the ILD layer 50 is at least partially removed to expose the dummy fins 92 at the first and second regions 301, 302, respectively, and the first and second dipole layers 14, 24 at the first and second regions 301, 302, respectively. The partial removal of the ILD layer 50 may be performed using a patterning process, for example, isotropic wet etching, anisotropic dry etching, other suitable techniques, or combinations thereof.

Figure 20:
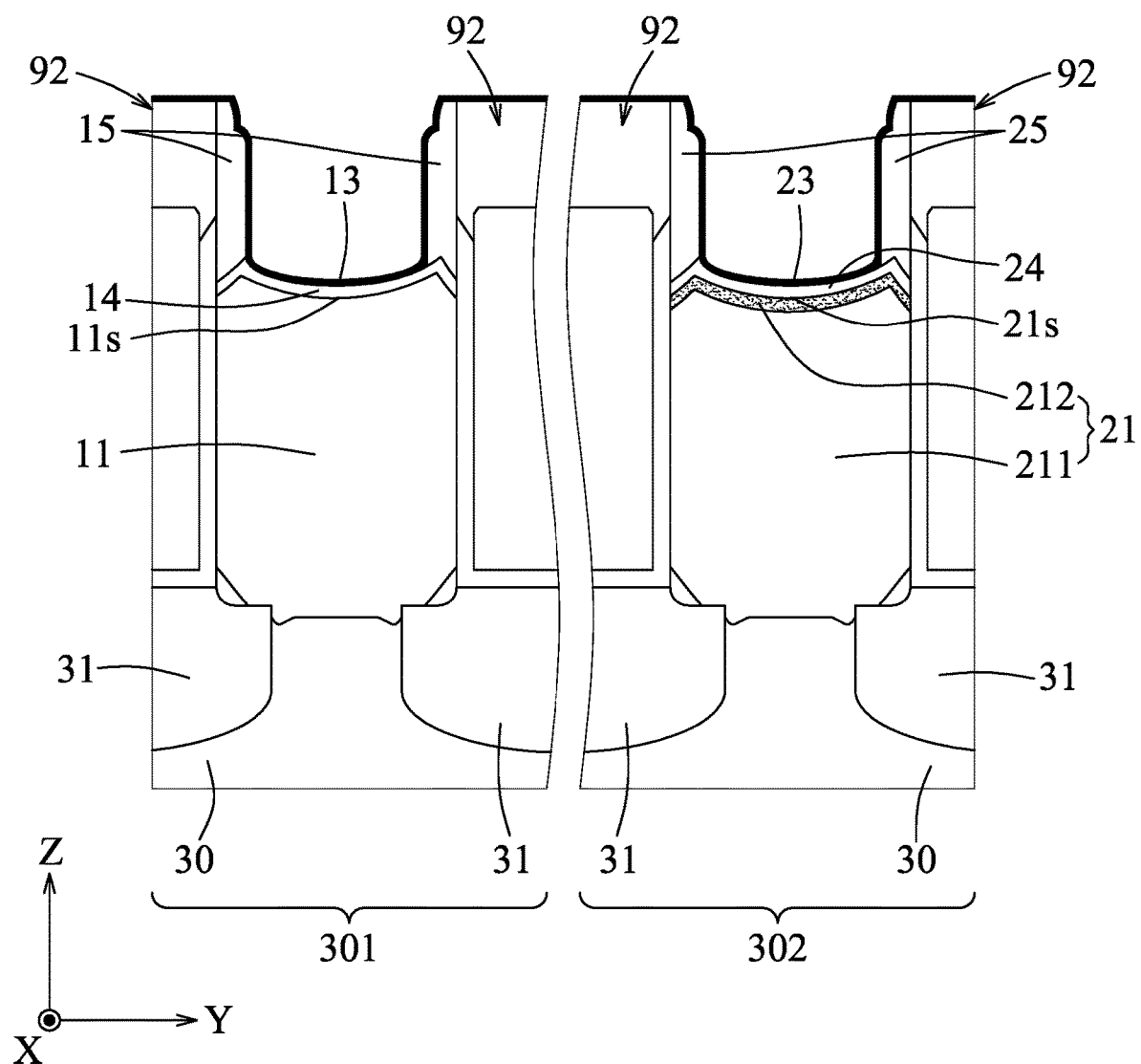

Referring to FIG. 14 and the examples illustrated in FIG. 20, the method 6 proceeds to step 66, where the first conductive carbon layers 13 are respectively formed on the first dipole layers 14 at each of the first regions 301, and the second conductive carbon layers 23 are respectively formed on the second dipole layers 24 at each of the second regions 302. In some embodiments, step 66 may be performed using a deposition process, for example, CVD, or vaper-phase epitaxy (VPE), but is not limited thereto. Other suitable techniques for forming the first and second conductive carbon layers 13, 23 are within the contemplated scope of the disclosure. In some embodiments, the first and second conductive carbon layers 13, 23 may be formed simultaneously, while in some other embodiments, the first and second conductive carbon layers 13, 23 may be formed separately. In some embodiments, as shown in FIG. 20, each of the first conductive carbon layers 13 is conformally formed over a corresponding one of the first dipole layers 14, and the dummy fins 92 and the first spacers 15 at two opposite sides of the corresponding first dipole layer 14. Each of the second conductive carbon layers 23 is conformally formed over a corresponding one of the second dipole layers 24, and the dummy fins 92 and the second spacers 25 at two opposite sides of the corresponding second dipole layer 24. Since the materials for the first and second conductive carbon layers 13, 23 are as described above, details thereof are omitted for the sake of brevity.

Figure 21:
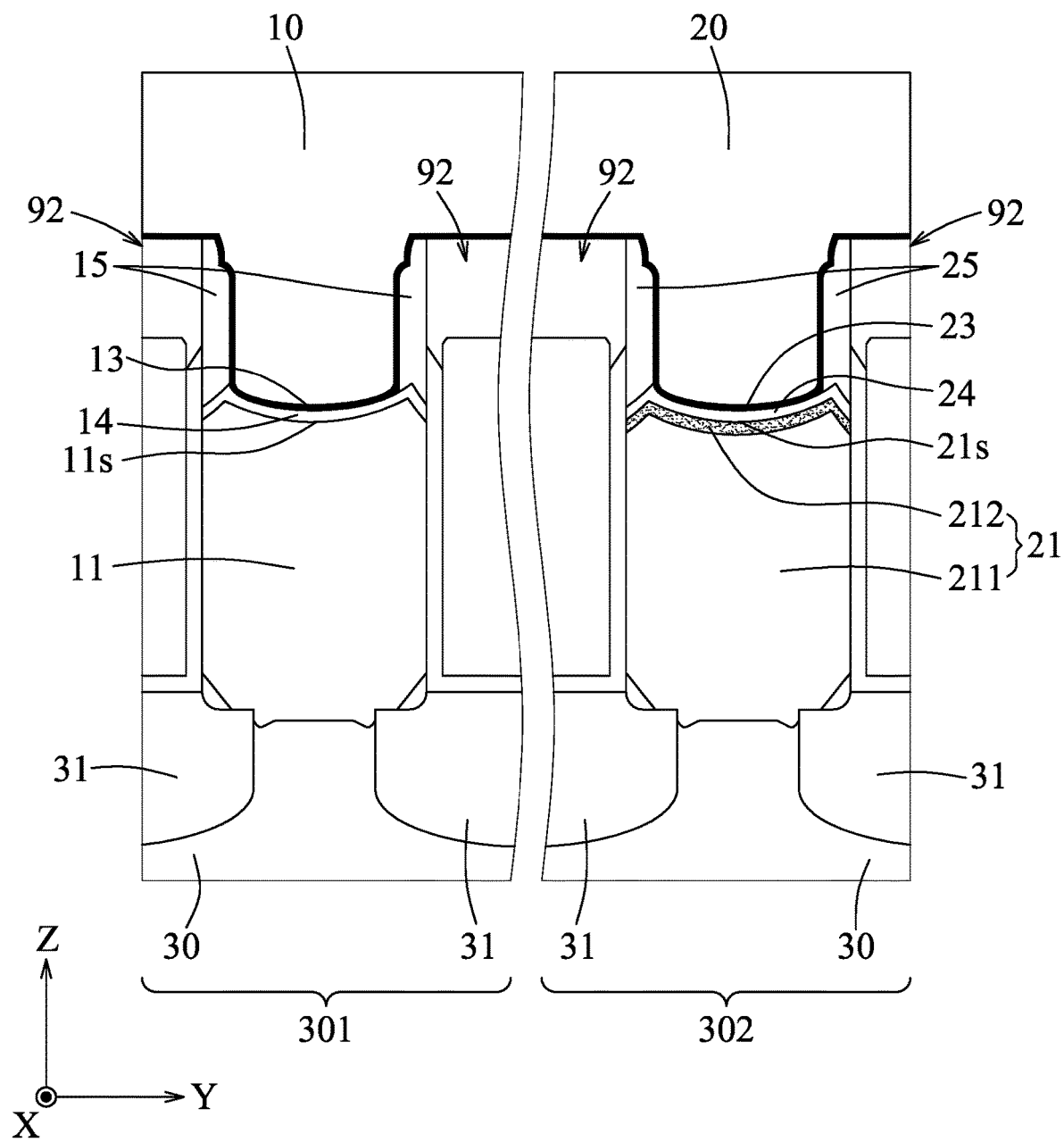

Referring to FIG. 14 and the examples illustrated in FIG. 21, the method 6 proceeds to step 67, where a first metal layer 10 is formed over the elements on the first regions 301 and a second metal layer 20 is formed over the elements on the second regions 302. In some embodiments, step 67 is performed using a deposition process, for example, CVD, PECVD, PVD, ALD or other suitable deposition techniques. In some embodiments, the first and second metal layers 10, 20 are made of the same conductive material, and may be formed simultaneously, while in some other embodiments, the first and second metal layers 10, 20 are made of different conductive materials, and may be separately formed. Since the suitable materials for the first and second metal layers 10, 20 are similar to those for forming the abovementioned first and second metal contacts 12, 22, respectively, details thereof are omitted for the sake of brevity.

Figure 22:
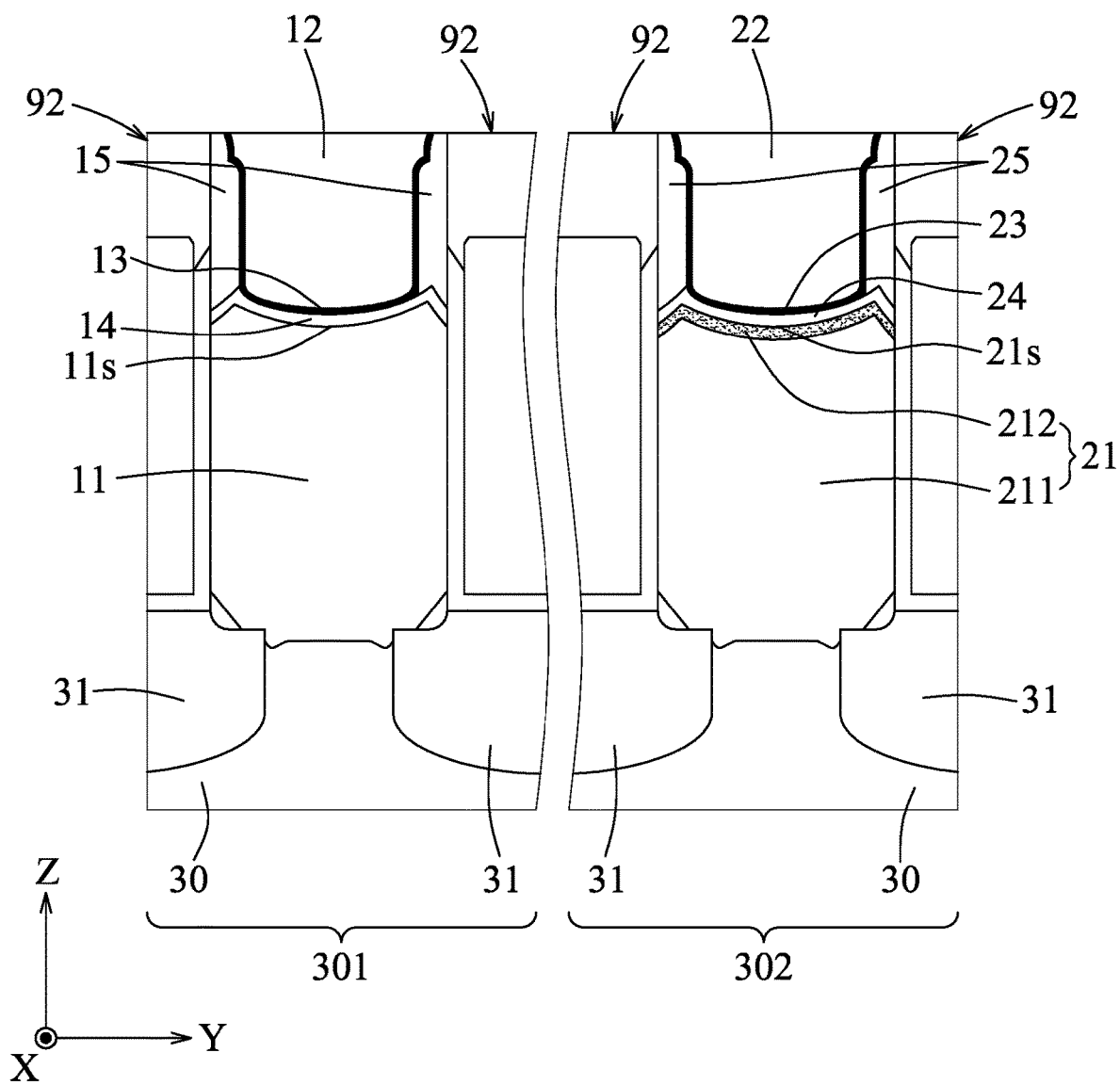

Referring to FIG. 14 and the examples illustrated in FIG. 22, the method 6 proceeds to step 68, where a planarization process is performed to expose upper surfaces of the dummy fins 92 at each of the first and second regions 301, 302. After the planarization process, an excess of the first metal layer 10 shown in FIG. 21 is removed to form the two first metal contacts 12 (the first metal contacts 12 are opposite in the X direction, and one of the first metal contacts 12 is shown in FIG. 22) at each of the first regions 301. After the planarization process, an excess of the second metal layer 20 shown in FIG. 21 is removed to form the two second metal contacts 22 (the second metal contacts 22 are opposite in the X direction, and one of the second metal contacts 22 is shown in FIG. 22) at each of the second regions 302. Although not shown in FIG. 22, the first and second metal contacts 12, 22 are formed in the patterned ILD layer 50. Furthermore, portions of the first conductive carbon layers 13, which are formed at the upper surfaces of the dummy fins 92 at each of the first regions 301, and portions of the second conductive carbon layers 23, which are formed at the upper surfaces of the dummy fins 92 at each of the second regions 302, are also removed after the planarization process. In some embodiments, step 68 is performed using, for example, but not limited to, CMP. Other suitable processes for performing the planarization process are within the contemplated scope of the disclosure.

In some embodiments, some steps in the method 6 may be modified, replaced, or eliminated without departure from the spirit and scope of the present disclosure. For example, when steps 62 and 64 are omitted, the semiconductor structure 1 shown in FIG. 4 can be obtained. When steps 62 and 64 are omitted, the first and second conductive carbon layers 13, 23 are selectively and respectively formed on the first and second source/drain portions 11, 21 in step 66, so that the semiconductor structure 1 shown in FIG. 3 can be obtained. When steps 62 and 64 are omitted, the first conductive carbon layers 13 are selectively and respectively formed on the first source/drain portions 11 in step 66 without forming the second conductive carbon layers 23, so that the semiconductor structure 1 shown in FIG. 1 can be obtained.

Figure 23:
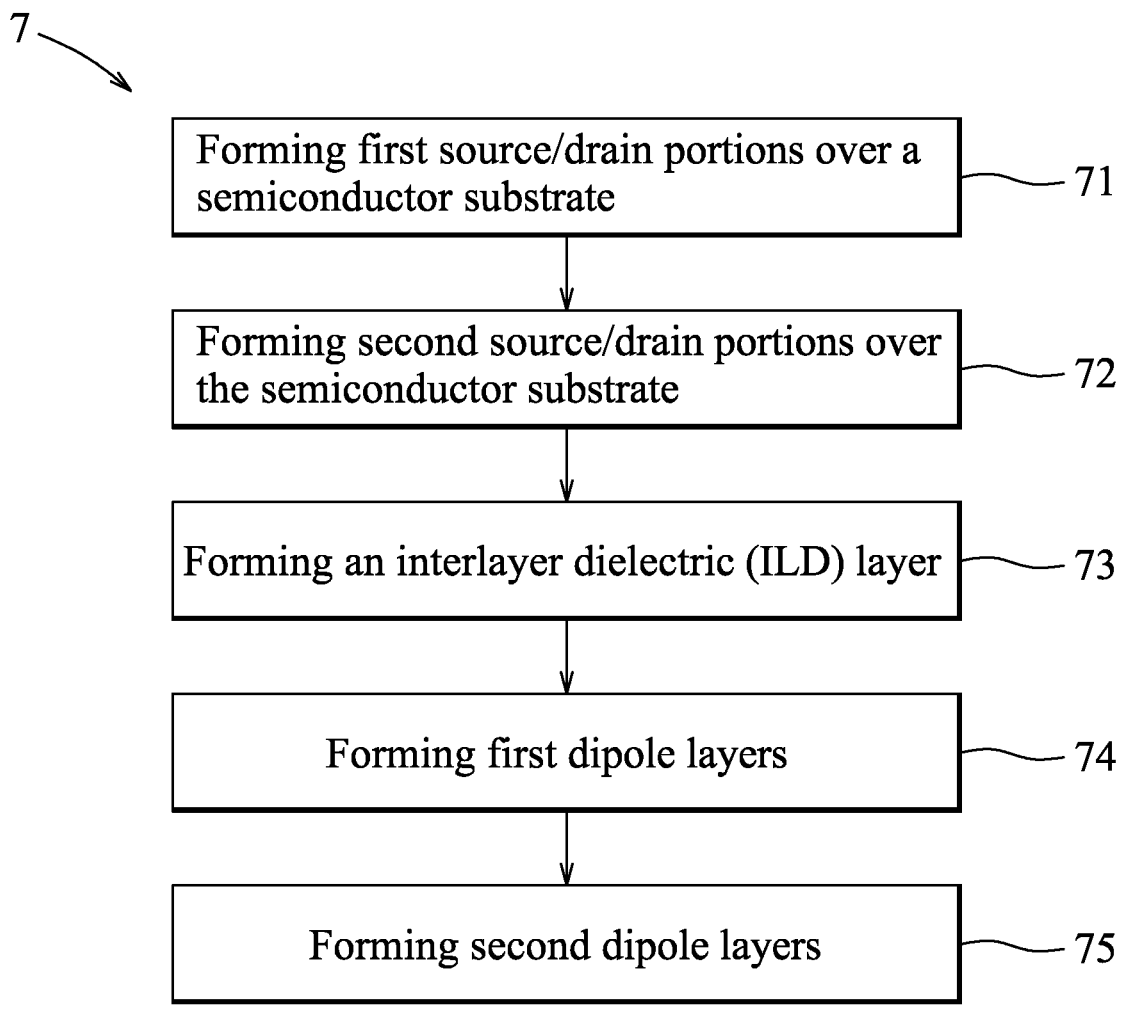
FIG. 23 is a flow diagram illustrating a method for manufacturing the semiconductor structure shown in FIG. 6 in accordance with some embodiments.

In some alternative embodiments, the semiconductor structure 1 may be made using another method 7. FIG. 23 is a flow diagram illustrating the method 7 for manufacturing a semiconductor structure (for example, but not limited to, the semiconductor structure 1 shown in FIG. 6) in accordance with some embodiments. The method 7 is similar to the method 6 except that the first and second dipole layers 14, 24 are formed after formation of the ILD layer 50 and that, in the method 7, steps 61 to 65 of the method 6 are replaced by steps 71 to 75. FIGS. 24 to 28 illustrate schematic views of the intermediate stages of the method 7 in accordance with some embodiments.

Figure 24:
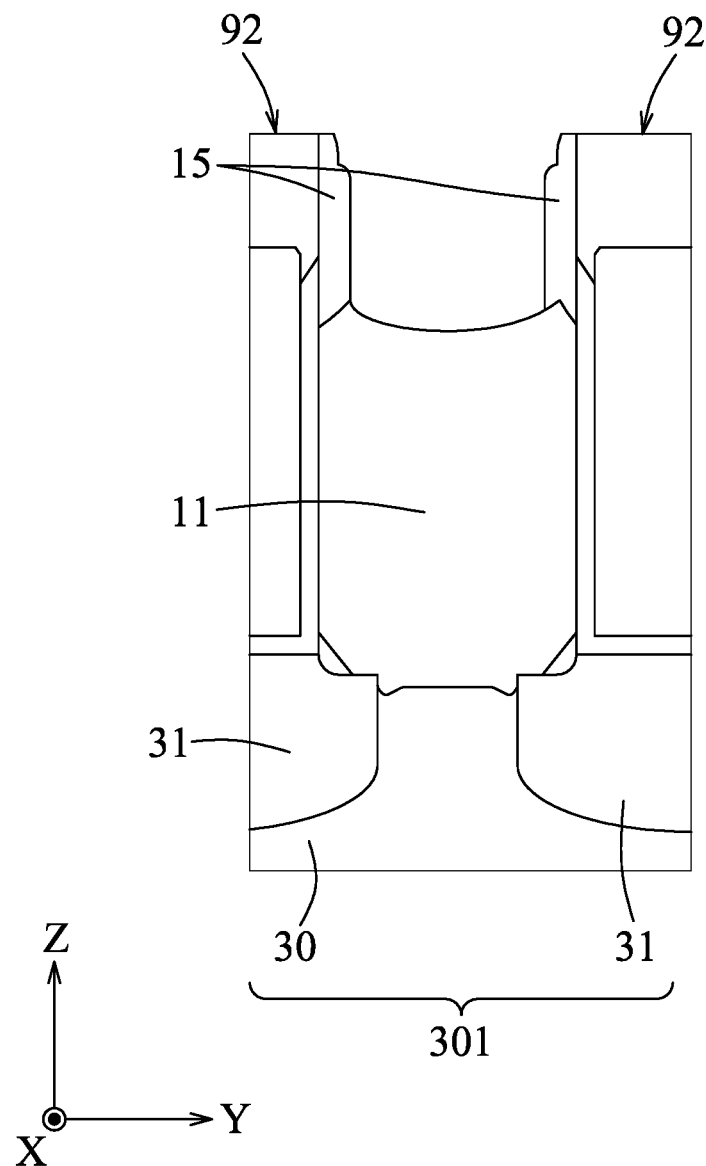
FIGS. 24 to 28 are schematic views illustrating intermediate stages of the method depicted in FIG. 23 in accordance with some embodiments.

Referring to FIG. 23 and the examples illustrated in FIG. 24, the method 7 begins at step 71, where the two first source/drain portions 11 are formed over each of the first regions 301 of the semiconductor substrate 30. In FIG. 24, the second regions 302 of the semiconductor substrate 30 and the elements thereon are omitted. Since step 71 is similar to step 61 as described above, details thereof are omitted for the sake of brevity.

In some embodiments, after the formation of the first source/drain portions 11, the first spacers 15 may be formed on the side surfaces of the two dummy fins 92 at the corresponding first region 301 to expose the first exposed portion of the first upper surface 11s of each of the first source/drain portions 11. Formation of the first spacers 15 is similar to those as described above, and thus details thereof are omitted for the sake of brevity.

Figure 25:
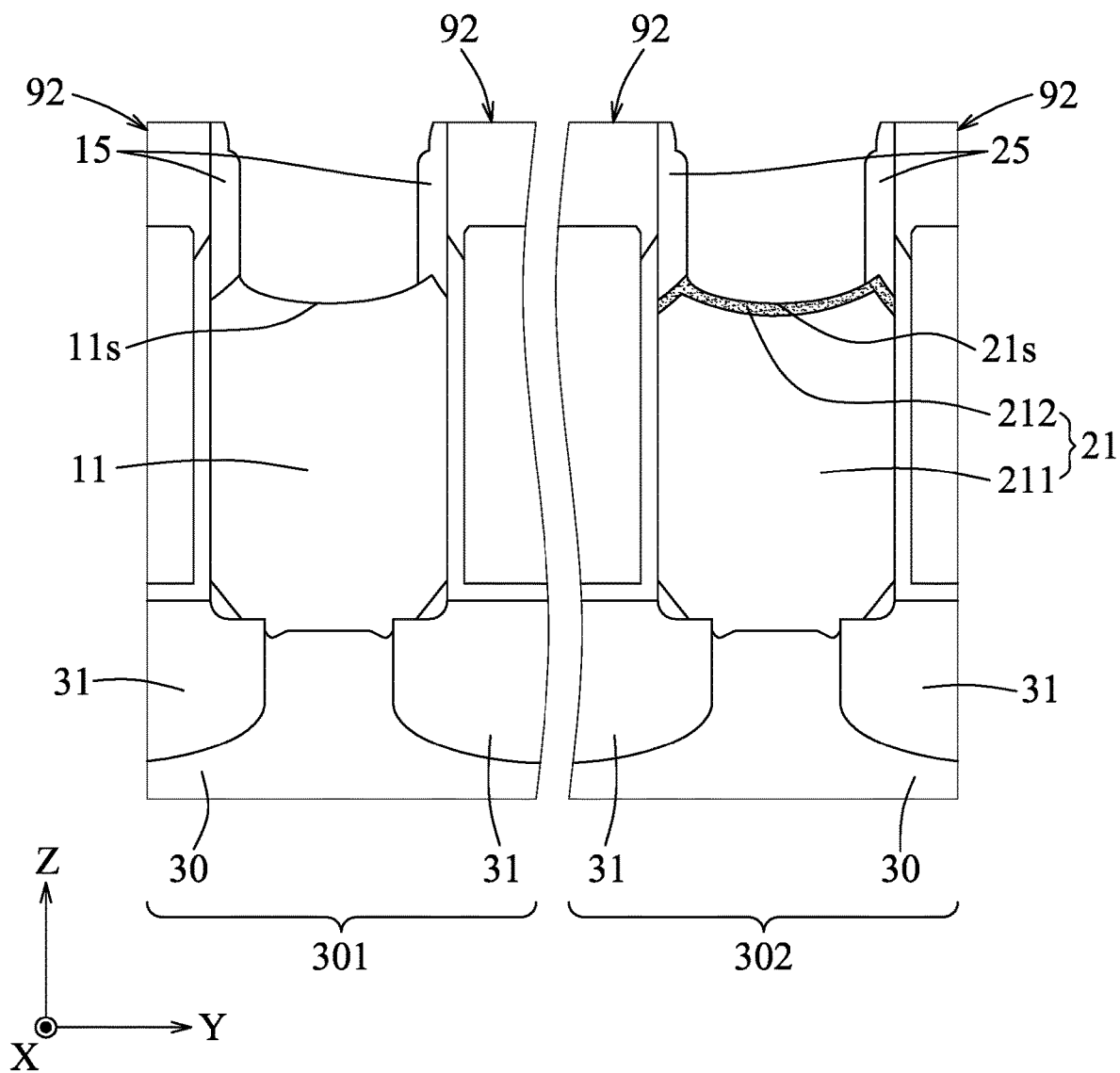

Referring to FIG. 23 and the examples illustrated in FIG. 25, the method 7 proceeds to step 72, where the two second source/drain portions 21 are formed over each of the second regions 302 of the semiconductor substrate 30. Since step 72 is similar to step 63 as described above, details thereof are omitted for the sake of brevity.

In some embodiments, after formation of the second source/drain portions 21, the second spacers 25 may be formed on the side surfaces of the two dummy fins 92 at the corresponding second region 302 to expose the second exposed portion of the second upper surface 21s of each of the second source/drain portions 21. Formation of the second spacers 25 is similar to those as described above, and thus details thereof are omitted for the sake of brevity. In some embodiments, the first and second spacers 15, 25 may be formed simultaneously after formation of the first and second source/drain portions 11, 21.

Figure 26:
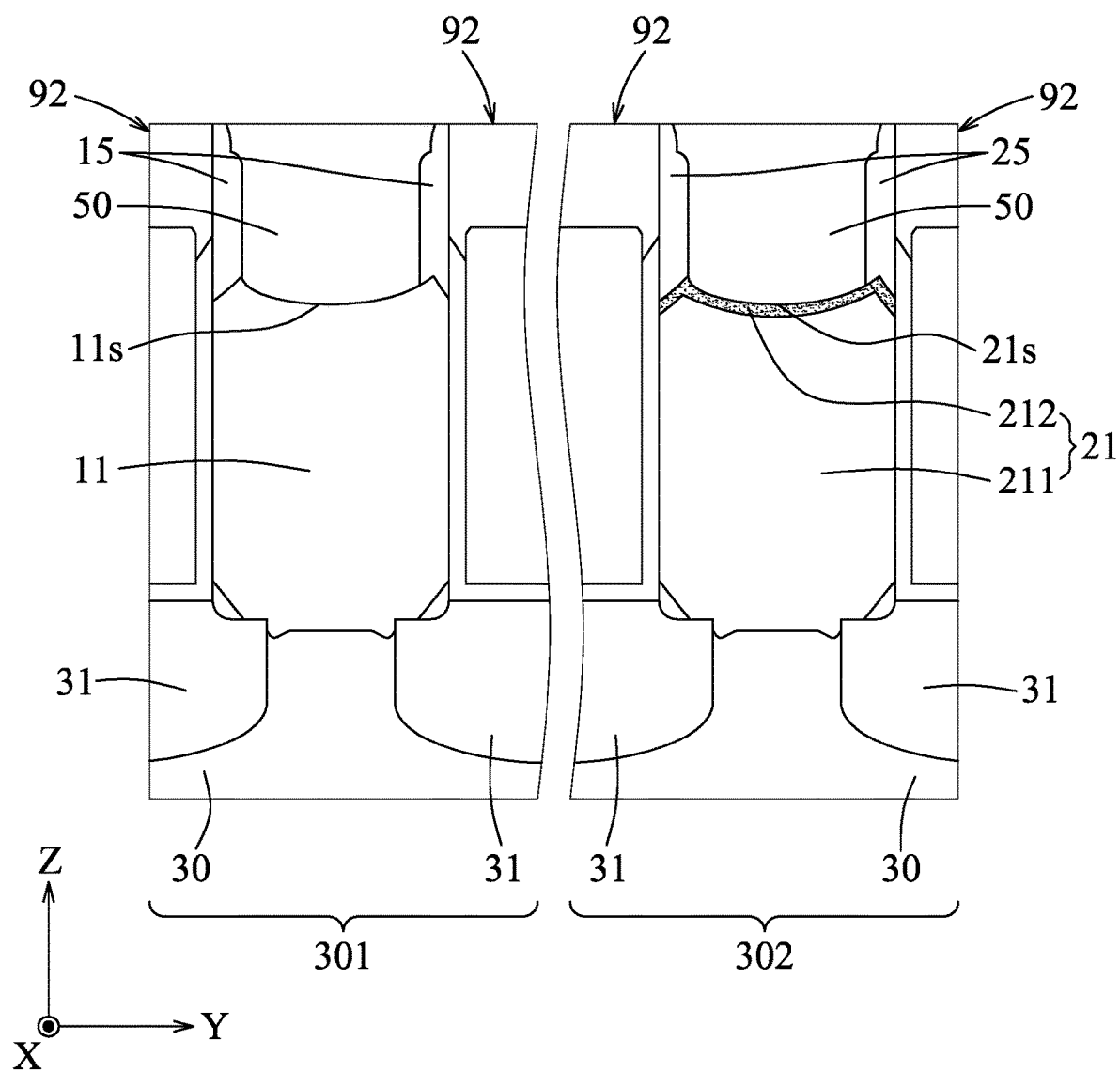

Referring to FIG. 23 and the examples illustrated in FIG. 26, the method 7 proceeds to step 73, where the ILD layer 50 is formed over the first source/drain portions 11 at each of the first regions 301 and over the second source/drain portions 21 at each of the second regions 302. Since the process for forming the ILD layer 50 is similar to those described above in step 65, details thereof are omitted for the sake of brevity.

Similar to those described above, in some embodiments, after formation of the ILD layer 50, a gate replacement process may be performed so as to form the gate feature 93 at each of the first and second regions 301, 302 (see FIGS. 2 and 26).

Figure 27:
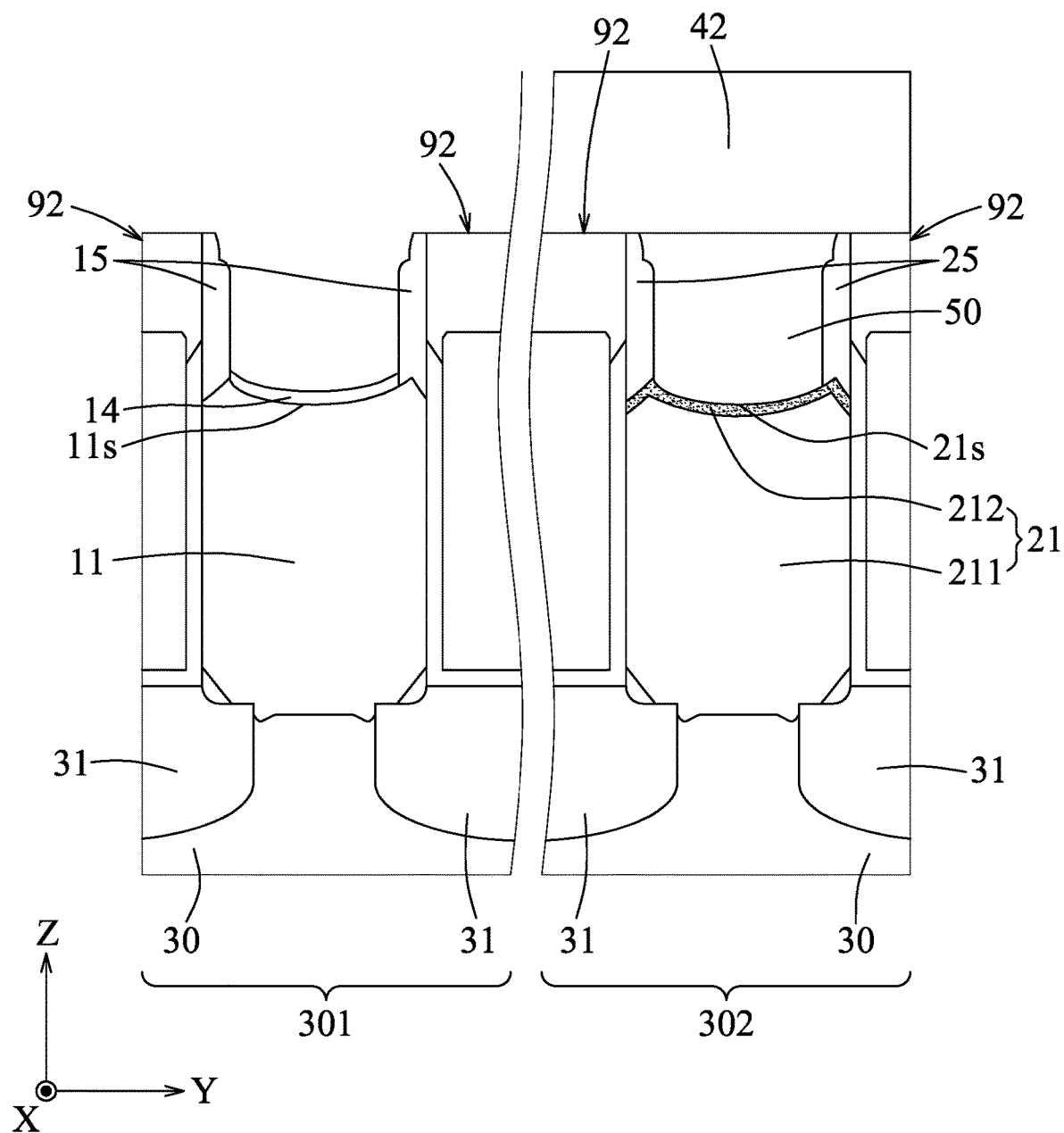

Referring to FIG. 23 and the examples illustrated in FIG. 27, the method 7 proceeds to step 74, where the two first dipole layers 14 (one of which is shown) are respectively formed on the first exposed portions of the first upper surfaces 11s of the first source/drain portions 11 at each of the first regions 301, after removal of first portions of the ILD layer 50. Since the possible process for forming the first dipole layers 14 is similar to that described in step 62, details thereof are omitted for the sake of brevity. In some embodiments, the removal of the first portions of the ILD layer 50 may include (i) forming a second patterned mark layer 42 over the structure shown in FIG. 26 by a suitable deposition process, (ii) performing a lithography process to expose the elements on the first regions 301, and (iii) selectively removing the first portions of the ILD layer 50 with respect to the dummy fins 92 and the first spacers 15 on the first regions 301 using an etching process, such as isotropic wet etching, anisotropic dry etching, other suitable techniques, or combinations thereof. After formation of the first dipole layers 14, the second patterned mask layer 42 is removed.

Figure 28:
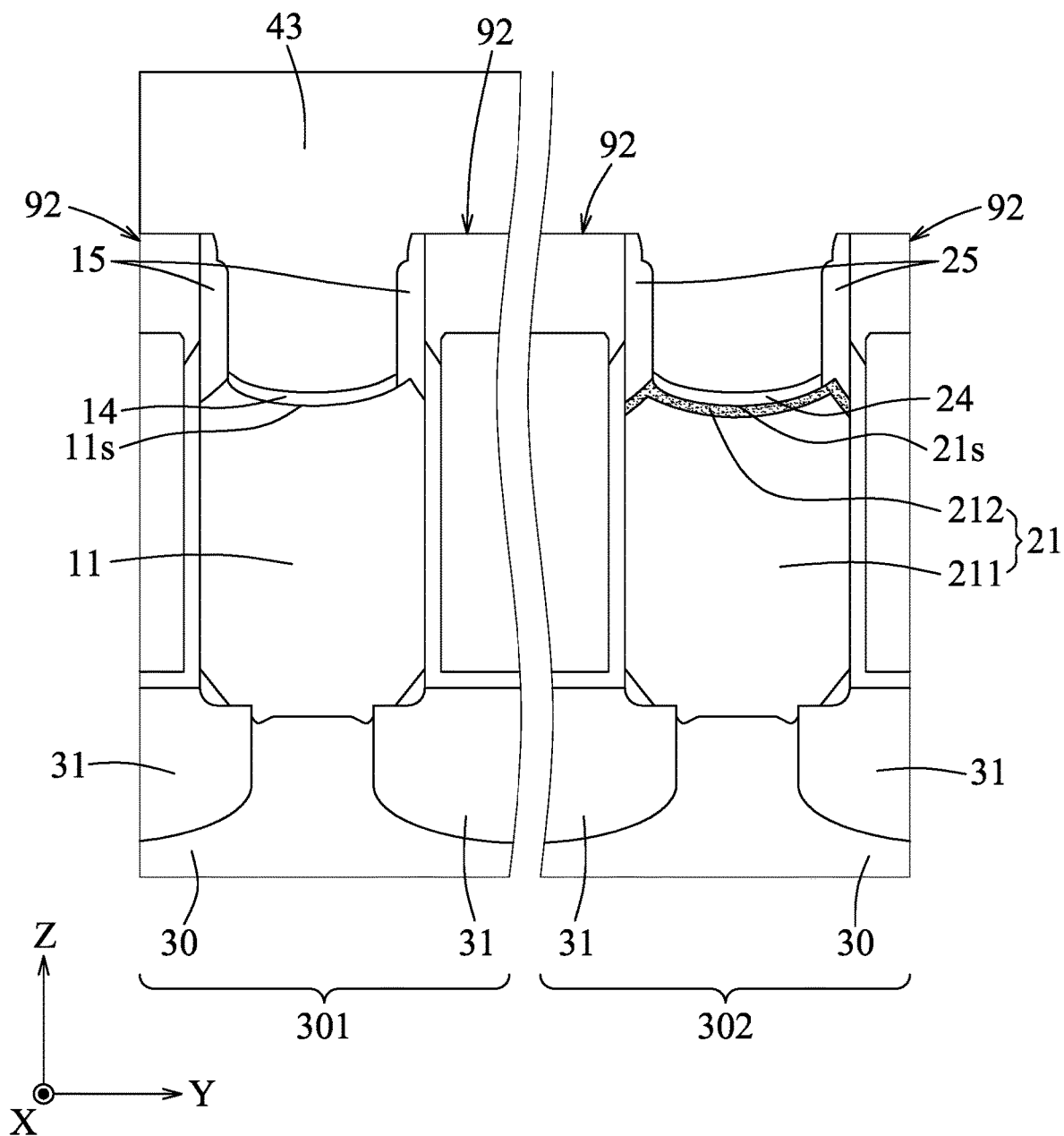

Referring to FIG. 23 and the examples illustrated in FIG. 28, the method 7 proceeds to step 75, where the two second dipole layers 24 (one of which is shown) are respectively formed on the second exposed portions of the second upper surfaces 21s of the second source/drain portions 21 at each of the second regions 302, after removal of second portions of the ILD layer 50. Since the possible process for forming the second dipole layers 24 is similar to that described in step 64, details thereof are omitted for the sake of brevity. In some embodiments, the removal of the second portions of the ILD layer 50 may include (i) forming a third patterned mark layer 43 over the structure shown in FIG. 27 after removal of the second patterned mask layer 42 using a suitable deposition process, (ii) performing a lithography process to expose the elements on the second regions 302, and (iii) selectively removing the second portions of the ILD layer 50 with respect to the dummy fins 92 and the second spacers 25 on the second regions 302 using an etching process, such as isotropic wet etching, anisotropic dry etching, other suitable techniques, or combinations thereof. After formation of the second dipole layers 24, the third patterned mask layer 43 is removed.

After step 75, the first and second conductive carbon layers 13, 23 are formed in a manner similar to that described above in step 66 (see also FIG. 20), the first and second metal layers 10, 20 are formed in a manner similar to that described above in step 67 (see also FIG. 21), and a planarization process is performed in a manner similar to that described above in step 68 so as to form the first and second metal contacts 12, 22 (see also FIG. 22). Other suitable methods may also be used for manufacturing the semiconductor structure 1 shown in FIG. 6.

In some embodiments, each of the methods 6, 7 further includes (i) sequentially forming a middle-end etching stop layer (not shown) and a middle-end ILD layer (not shown) on the structure shown in FIG. 22, and (ii) forming via contacts (not shown) each of which penetrates the middle-end etching stop layer and the middle-end ILD layer so as to be electrically connected to the first and second metal contacts 12, 22 on the first and second regions 301, 302, respectively. In some embodiments, additional manufacturing techniques may be employed to complete the fabrication of the semiconductor structure 1.

In some embodiments, some steps in the method 7 may be modified, replaced, or eliminated without departure from the spirit and scope of the present disclosure. For example, when steps 74 and 75 are omitted and when the first and second conductive carbon layers 13, 23 are respectively formed on the first and second source/drain portions 11, 21 in step 76, the semiconductor structure 1 shown in FIG. 4 can be obtained. Further, when steps 74 and 75 are omitted and when in step 76, the first and second conductive carbon layers 13, 23 are formed by a selective deposition process on the first and second source/drain portions 11, 21 that are made of semiconductor materials, rather than on the first and second spacers 15, 25 or the dummy fins 92 that are made of dielectric materials, the semiconductor structure 1 shown in FIG. 3 can be obtained. In some alternative embodiments, other suitable methods may also be applied for forming the semiconductor structure 1.

In this disclosure, by introducing a conductive carbon layer and/or a dipole layer between a metal contact and a source/drain portion (i.e., a metal-semiconductor junction) of a semiconductor structure, an Rcsd at the metal-semiconductor junction is significantly reduced regardless of whether the semiconductor structure is a p-FET or an n-FET. This effect is achieved due to effective de-pinning of a Fermi level by the conductive carbon layer, and due to effective change of the conduction band edge and the valence band edge of the semiconductor side (i.e., the source/drain portion) to thereby reduce SBH. Furthermore, since some of the lithography processes and high temperature processes required in fabrication of a semiconductor structure with a silicide layer can be omitted in the method of this disclosure, the semiconductor structure of this disclosure, in comparison with the semiconductor structure with the silicide layer, may be made at a relatively lower temperature and at a relatively lower cost, and may have a relatively lower thermal budget.

In accordance with some embodiments of the present disclosure, a semiconductor structure includes a semiconductor substrate, a first source/drain portion, a second source/drain portion, a first metal contact, a second metal contact and a first conductive carbon layer. The first and second source/drain portions are formed over the semiconductor substrate, and are spaced apart from each other. The first source/drain portion has a conductivity type different from that of the second source/drain portion. The first and second metal contacts are respectively formed on the first and second source/drain portions. The first conductive carbon layer is formed between the first source/drain portion and the first metal contact.

In accordance with some embodiments of the present disclosure, the semiconductor structure further includes a second conductive carbon layer formed between the second source/drain portion and the second metal contact.

In accordance with some embodiments of the present disclosure, each of the first and second conductive carbon layers is a graphene layer.

In accordance with some embodiments of the present disclosure, each of the first and second conductive carbon layers has a thickness ranging from 2 Å to 10 Å.

In accordance with some embodiments of the present disclosure, the semiconductor structure further includes a first dipole layer disposed between the first source/drain portion and the first conductive carbon layer.

In accordance with some embodiments of the present disclosure, the first source/drain portion has an n-type conductivity. The first dipole layer includes phosphorus (P), arsenic (As), hafnium (Hf), zirconium (Zr), erbium (Er), or combinations thereof.

In accordance with some embodiments of the present disclosure, the semiconductor structure further includes a second dipole layer disposed between the second source/drain portion and the second conductive carbon layer.

In accordance with some embodiments of the present disclosure, the second source/drain portion has a p-type conductivity. The second dipole layer includes boron (B), gallium (Ga), indium (In), scandium (Sc), copper (Cu), nickel (Ni), tungsten (W), ruthenium (Ru), silver (Ag), platinum (Pt), or combinations thereof.

In accordance with some embodiments of the present disclosure, each of the first and second dipole layers has a thickness of at least one atomic layer.

In accordance with some embodiments of the present disclosure, a method for manufacturing a semiconductor structure includes: forming a first source/drain portion over a semiconductor substrate; forming a second source/drain portion over the semiconductor substrate, the second source/drain portion having a conductivity type different from that of the first source/drain portion; forming a dielectric layer over the first and second source/drain portions; forming a first metal contact and a second metal contact in the dielectric layer such that the first and second metal contacts are disposed on the first and second source/drain portions, respectively; and forming a first conductive carbon layer between the first source/drain portion and the first metal contact.

In accordance with some embodiments of the present disclosure, the method further includes forming a second conductive carbon layer between the second source/drain portion and the second metal contact.

In accordance with some embodiments of the present disclosure, each of the first and second conductive carbon layers is a graphene layer.

In accordance with some embodiments of the present disclosure, the first and second conductive carbon layers are formed after forming the dielectric layer and before forming the first and second metal contacts.

In accordance with some embodiments of the present disclosure, the method further includes: forming a first dipole layer between the first source/drain portion and the first conductive carbon layer; and forming a second dipole layer between the second source/drain portion and the second conductive carbon layer.

In accordance with some embodiments of the present disclosure, each of the first and second dipole layers is formed before forming the dielectric layer.

In accordance with some embodiments of the present disclosure, each of the first and second dipole layers is formed after forming the dielectric layer and before forming the first and second metal contacts.

In accordance with some embodiments of the present disclosure, a method for reducing contact resistance includes: providing a source/drain portion; forming a graphene layer on the source/drain portion; and forming a metal contact on the graphene layer.

In accordance with some embodiments of the present disclosure, the method further includes, before forming the graphene layer, forming a dipole layer on the source/drain portion, such that the dipole layer is disposed between the source/drain portion and the graphene layer.

In accordance with some embodiments of the present disclosure, the source/drain portion has an n-type conductivity. The dipole layer includes phosphorus (P), arsenic (As), hafnium (Hf), zirconium (Zr), erbium (Er), or combinations thereof.

In accordance with some embodiments of the present disclosure, the source/drain portion has a p-type conductivity. The dipole layer includes boron (B), gallium (Ga), indium (In), scandium (Sc), copper (Cu), nickel (Ni), tungsten (W), ruthenium (Ru), silver (Ag), platinum (Pt), or combinations thereof.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a semiconductor substrate;

a first source/drain portion and a second source/drain portion which are formed over the semiconductor substrate, and which are spaced apart from each other, the first source/drain portion including a first type semiconductor material, the second source/drain portion including a second type semiconductor material, the first type semiconductor material having a conductivity type different from that of the second type semiconductor material, each of the first source/drain portion and the second source/drain portion having an upper surface which has a main surface region and two lateral surface regions, the two lateral surface regions being located at two opposite sides of the main surface region, respectively;

a first metal contact and a second metal contact which are electrically connected to the first source/drain portion and the second source/drain portion, respectively; and a first conductive carbon layer formed between the first source/drain portion and the first metal contact, the first conductive carbon layer covering the main surface region of the upper surface of the first source/drain portion, without covering the two lateral surface regions of the upper surface of the first source/drain portion.

2. The semiconductor structure of claim 1, further comprising first dummy fins disposed to sandwich the first source/drain portion, and spaced apart from the first conductive carbon layer, second dummy fins disposed to sandwich the second source/drain portion, and a second conductive carbon layer formed between the second source/drain portion and the second metal contact, and spaced apart from the second dummy fins, the second conductive carbon layer covering the main surface region of the upper surface of the second source/drain portion, without covering the two lateral surface regions of the upper surface of the second source/drain portion.

3. The semiconductor structure of claim 2, wherein each of the first and second conductive carbon layers is a graphene layer.

4. The semiconductor structure of claim 2, wherein each of the first and second conductive carbon layers has a thickness ranging from 2 Å to 10 Å.

5. The semiconductor structure of claim 2, further comprising a first dipole layer disposed between the first source/drain portion and the first conductive carbon layer.

6. The semiconductor structure of claim 5, wherein the first source/drain portion has an n-type conductivity, the first dipole layer including phosphorus (P), arsenic (As), hafnium (Hf), zirconium (Zr), erbium (Er), or combinations thereof.

7. The semiconductor structure of claim 5, further comprising a second dipole layer disposed between the second source/drain portion and the second conductive carbon layer.

8. The semiconductor structure of claim 7, wherein the second source/drain portion has a p-type conductivity, the second dipole layer including boron (B), gallium (Ga), indium (In), scandium (Sc), copper (Cu), nickel (Ni), tungsten (W), ruthenium (Ru), silver (Ag), platinum (Pt), or combinations thereof.

9. The semiconductor structure of claim 7, wherein each of the first and second dipole layers has a thickness of at least one atomic layer.

10. A method for manufacturing a semiconductor structure, comprising:

forming a first source/drain portion over a semiconductor substrate, the first source/drain portion including a first type semiconductor material;

forming a second source/drain portion over the semiconductor substrate, the second source/drain portion including a second type semiconductor material that has a conductivity type different from that of the first type semiconductor material;

after forming the first source/drain portion and the second source/drain portion, forming a dielectric layer over the first and second source/drain portions opposite to the semiconductor substrate;

forming a first metal contact and a second metal contact in the dielectric layer such that the first and second metal contacts are disposed on the first and second source/drain portions, respectively; and forming a first conductive carbon layer between the first source/drain portion and the first metal contact, wherein the first conductive carbon layer is formed after forming the dielectric layer and before forming the first and second metal contacts.

11. The method of claim 10, further comprising:

forming a second conductive carbon layer between the second source/drain portion and the second metal contact.

12. The method of claim 11, wherein each of the first and second conductive carbon layers is a graphene layer.

13. The method of claim 11, wherein the second conductive carbon layer is formed after forming the dielectric layer and before forming the first and second metal contacts.

14. The method of claim 10, further comprising:

forming a first dipole layer between the first source/drain portion and the first conductive carbon layer; and forming a second dipole layer between the second source/drain portion and the second conductive carbon layer.

15. The method of claim 14, wherein each of the first and second dipole layers is formed before forming the dielectric layer.

16. The method of claim 14, wherein each of the first and second dipole layers is formed after forming the dielectric layer and before forming the first and second metal contacts.

17. A method for manufacturing a semiconductor structure, comprising:

forming a semiconductor fin which includes a middle portion and two recessed portions located at two opposite sides of the middle portion;

forming two source/drain portions respectively on the two recessed portions so as to permit the middle portion to serve as a channel, the two source/drain portions including a semiconductor material doped with impurities;

after forming the two source/drain portions, forming a dielectric layer over the two source/drain portions;

forming two metal contacts in the dielectric layer such that the two metal contacts are disposed on the two source/drain portions, respectively;

forming two conductive carbon layers each of which is formed between one of the two source/drain portions and a corresponding one of the two metal contacts; and before forming the dielectric layer, forming two dipole layers, each of which is formed between one of the two source/drain portions and a corresponding one of the two conductive carbon layers.

18. The method of claim 17, wherein each of the two conductive carbon layers is a graphene layer.

19. The method of claim 17, further comprising forming a gate feature over the middle portion, the gate feature including a gate dielectric and a gate electrode, the gate dielectric being formed on the middle portion so as to separate the middle portion from the gate electrode.

20. The method of claim 17, wherein
when the two source/drain portions have an n-type conductivity, each of the two dipole layers includes phosphorus (P), arsenic (As), hafnium (Hf), zirconium (Zr), erbium (Er), or combinations thereof, and
when the two source/drain portions have a p-type conductivity, each of the two dipole layers includes boron (B), gallium (Ga), indium (In), scandium (Sc), copper (Cu), nickel (Ni), tungsten (W), ruthenium (Ru), silver (Ag), platinum (Pt), or combinations thereof.

* * * * *